United States Patent
Ando et al.

(10) Patent No.: US 7,521,716 B2
(45) Date of Patent: Apr. 21, 2009

(54) ELECTRODE SUBSTRATE, THIN-FILM TRANSISTOR, DISPLAY AND ITS PRODUCTION METHOD

(75) Inventors: Masahiko Ando, Hatoyama (JP); Masaya Adachi, Hitachi (JP); Hiroshi Sasaki, Hitachi (JP); Masatoshi Wakagi, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 150 days.

(21) Appl. No.: 10/569,834

(22) PCT Filed: Aug. 18, 2004

(86) PCT No.: PCT/JP2004/012143

§ 371 (c)(1),
(2), (4) Date: Feb. 28, 2006

(87) PCT Pub. No.: WO2005/024956

PCT Pub. Date: Mar. 17, 2005

(65) Prior Publication Data

US 2006/0261334 A1     Nov. 23, 2006

(30) Foreign Application Priority Data

Sep. 4, 2003    (JP) ............................. 2003-312079

(51) Int. Cl.
*H01L 29/04* (2006.01)
(52) U.S. Cl. ........................... 257/72; 257/59; 257/347; 257/E21.414; 257/E29.294; 348/149; 348/151
(58) Field of Classification Search .................. 257/72, 257/59, 347; 438/149, 151
See application file for complete search history.

(56) References Cited

U.S. PATENT DOCUMENTS

2004/0129978 A1*    7/2004    Hirai ........................... 257/347

FOREIGN PATENT DOCUMENTS

| EP | 1 128 438 A1 | 8/2001 |
|---|---|---|
| EP | 1 434 281 A2 | 6/2004 |
| JP | 64-72163 | 3/1989 |
| JP | 5-175233 | 7/1993 |
| JP | 8-264793 | 10/1996 |
| JP | 2003-149831 | 5/2003 |

(Continued)

OTHER PUBLICATIONS

Nikkei Electronics Jun. 17, 2002, (pp. 67-78).

(Continued)

*Primary Examiner*—A. Sefer
(74) *Attorney, Agent, or Firm*—Antonelli, Terry, Stout & Kraus, LLP.

(57) ABSTRACT

Using a lower electrode as a photomask, a lyophobic region having generally the same pattern as that of the lower electrode and a lyophilic region having a pattern which is generally the inversion of the lower electrode pattern are formed on an insulating film. A conductive ink is applied to the lyophobic region and baked. Thus, an upper electrode having a pattern which is generally the inversion of the lower electrode pattern is formed in a self-alignment manner. Therefore no misalignment occurs even if a printing method is used. Thus, a semiconductor device such as an active-matrix thin-film transistor substrate can be fabricated by using a printing method.

10 Claims, 19 Drawing Sheets

FOREIGN PATENT DOCUMENTS

| | | |
|---|---|---|
| JP | 2003-158134 | 5/2003 |
| JP | 2003-162058 | 6/2003 |
| JP | 2004-157151 | 6/2004 |
| WO | WO 02/095805 A3 | 11/2002 |
| WO | WO 2005/022664 A3 | 3/2005 |

OTHER PUBLICATIONS

Search Report/Office Action dated Jun. 28, 2007; 6 pages.
Inkjet printing of polymer thin film transistors; Takeo Kawase, et al.; 2003; pp. 279-287.

* cited by examiner

FIG.12
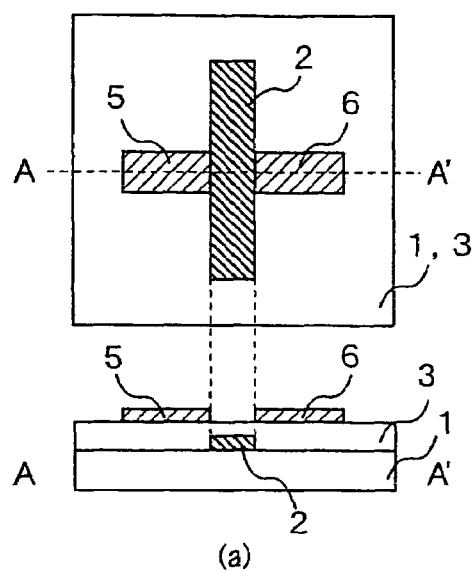
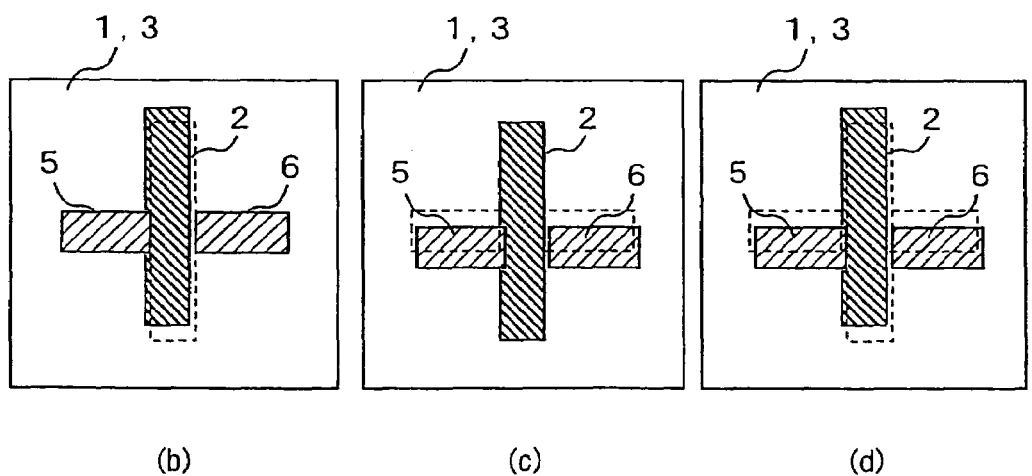
(a)
(b)　　　(c)　　　(d)

FIG.14
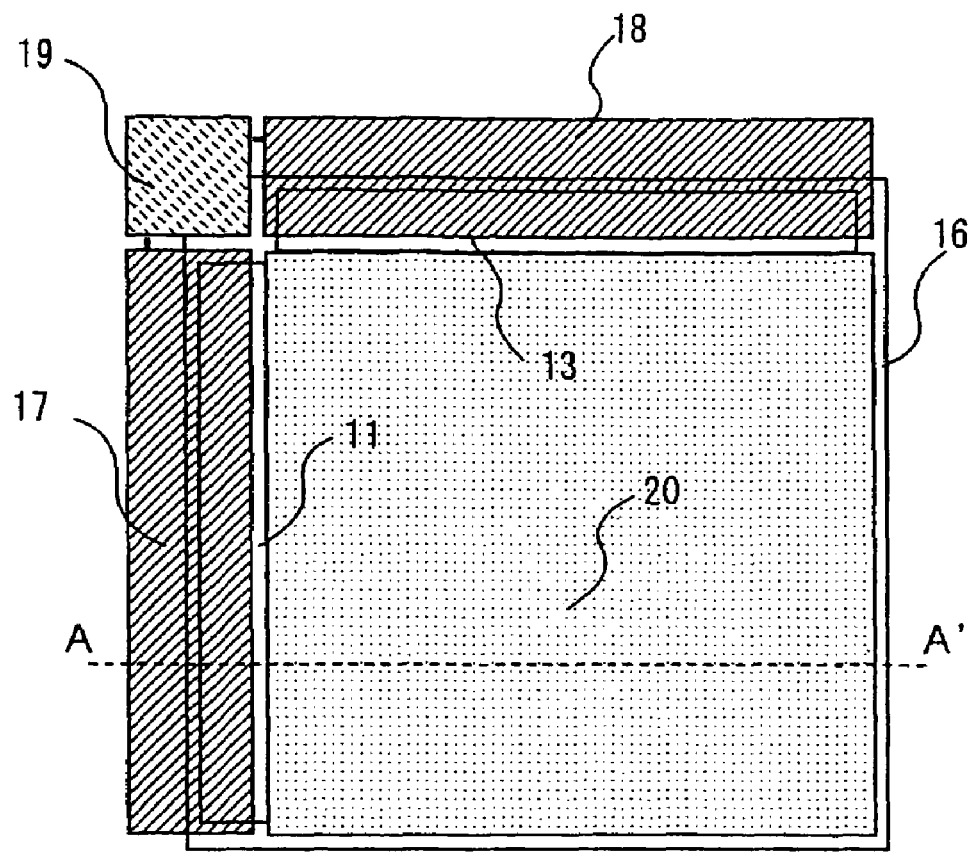
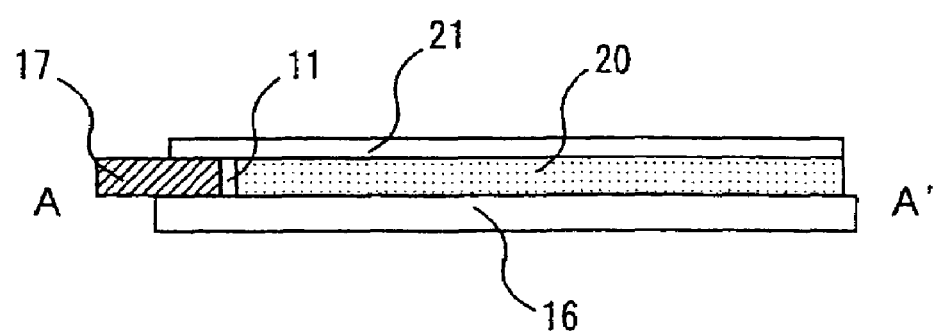

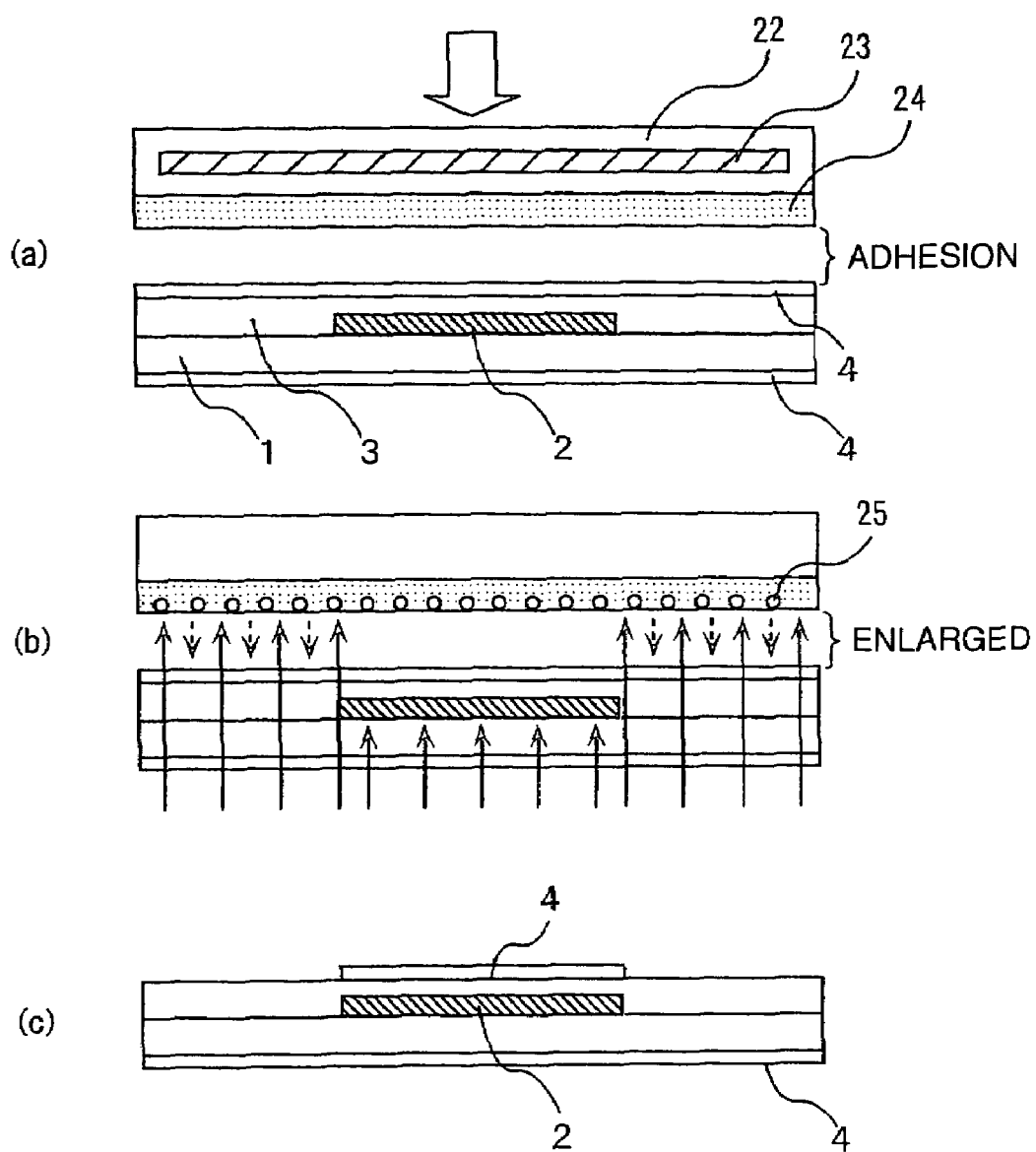

| | | |
|---|---|---|
| (1) | FORMATION OF METAL FILM UNDER VACUUM | ⎫ |
| (2) | COATING OF RESIST | |
| (3) | HEAT TREATMENT | |
| (4) | EXPOSURE | FIRST ELECTRODE |
| (5) | DEVELOPMENT | |
| (6) | HEAT TREATMENT | |
| (7) | PROCESSING OF METAL FILM | |
| (8) | REMOVAL OF RESIST | ⎭ |
| (9) | FORMATION OF INSULATING FILM | |
| (10) | FORMATION OF METAL FILM UNDER VACUUM | ⎫ |
| (11) | COATING OF RESIST | |
| (12) | HEAT TREATMENT | |
| (13) | EXPOSURE | SECOND ELECTRODE |
| (14) | DEVELOPMENT | |
| (15) | HEAT TREATMENT | |
| (16) | PROCESSING OF METAL FILM | |
| (17) | REMOVAL OF RESIST | ⎭ |

(b)

| | | |
|---|---|---|
| (1) | PRINTING FORMATION OF METAL FILM | ⎫ FIRST ELECTRODE |
| (2) | HEAT TREATMENT | ⎭ |
| (3) | FORMATION OF INSULATING FILM | |
| (4) | COATING OF WATER REPELLENT FILM | ⎫ WATER REPELLENT |
| (5) | BACKSIDE EXPOSURE | ⎭ |
| (6) | PRINTING FORMATION OF METAL FILM | ⎫ SECOND ELECTRODE |
| (7) | HEAT TREATMENT | ⎭ |

US 7,521,716 B2

ELECTRODE SUBSTRATE, THIN-FILM TRANSISTOR, DISPLAY AND ITS PRODUCTION METHOD

TECHNICAL FIELD

The present invention relates to an electrode substrate in which a lower electrode and an upper electrode face each other with an insulating film interposing therebetween and a semiconductor device using the electrode substrate such as a thin film transistor and a display device, and to production methods thereof.

BACKGROUND ART

An electrode substrate in which a lower electrode and an upper electrode face each other with an insulating film interposing therebetween includes, for example, an electrode substrate used in a thin film transistor in an active matrix driving liquid crystal display device. In this electrode substrate, the lower electrode to be a gate wiring/electrode, a gate insulating film, and the upper electrode to be a source/drain electrode and signal wiring are formed in this mentioned order through lamination on a substrate formed of glass or the like. High-precision formation, on a large-area substrate, of a thin film transistor and a display device driven by the thin film transistor requires that the lower electrode and upper electrode to constitute wirings/electrodes and others each be fabricated into a fine pattern and be disposed so as to be accurately aligned with each other. Accordingly, as a general method for fabricating the lower and upper electrodes, there is applied a so-called photolithography technique to use separate photomasks for the upper and lower electrodes. In this method, a photomask that has been beforehand finely fabricated is placed on a (positive type) photoresist deposited on an electrode; the photoresist is irradiated with light to remove the photoresist in the exposed area; the electrode is removed from the region not covered with the photoresist to fabricate the electrode; and finally the photoresist is removed. Accurate alignment of the photomask to be used in fabricating each of the electrodes, with respect to the substrate, makes it possible to accurately align the pattern of each of the electrodes.

A backside exposure method is known as a method for accurately aligning a lower electrode and an upper electrode. The method concerned is a method which auxiliarily utilizes "a part" of the lower metal electrode as a photomask for specifying "a part" of the pattern of the upper electrode. Details of this method are described, for example, in Japanese Patent No. 3,304,671 of the present inventor.

In these years, a method for producing electrodes by using a printing method, in place of a photolithography method, to be a so-called direct-drawing method, such as inkjet, plating, or offset printing, has been actively studied as a method for forming the electrodes for use in these electrode substrates, as described, for example, in Nikkei Electronics, No. 6.17, pp. 67-78, 2002. In these printing methods, required materials are disposed for electrode formation in required positions. Accordingly, these printing methods are less in number of production steps and higher in utilization efficiency of materials than a photolithography method, promising such an advantage that an electrode substrate can be formed at a low cost. The above cited reference describes a case where a metal wiring of 5 μm or less in wiring width was formed by an inkjet method, as a case of a fine electrode pattern formed by a printing method.

A thin film transistor using the above described electrode substrate is applied to an active matrix driving display device, and applied to a flat image-display device such as a display device in a laptop personal computer, a cellular phone or a flat television set so that used as display elements are, for example, liquid crystal elements, organic electroluminescence elements, electrophoresis elements or the like. In addition, there is a trend to apply a thin film transistor using the above described electrode substrate to RFID typified by a contactless IC card as a contactless information medium. In any one of these cases, such a thin film transistor is applied as a man-machine interface device, through the intermediary of images and communication information, to fundamental products that support the highly information-based society.

DISCLOSURE OF THE INVENTION

In the above described prior arts, if in place of a photolithography method a printing method can be used as a method for forming an electrode substrate in which a lower electrode and an upper electrode, which have fine patterns and are accurately aligned to each other, face each other with an insulating film therebetween, the number of production steps will be drastically reduced and the utilization efficiency of materials will be improved, promising an advantage that a large number of electrode substrates can be formed at a low cost.

However, it has hitherto been difficult to apply a printing method, particularly as a method for forming electrodes, to the electrode substrate having the above described configuration, because of the following reasons. Specifically, in an electrode formed by using a printing method, "misalignment" is caused when an electrode with fine shapes is transferred onto a substrate from a printing device. Consequently, there is a problem such that even when at least one of a lower electrode and an upper electrode formed on the lower electrode trough an interposing insulating layer can be formed to have a fine pattern by using a printing method, both of the electrodes cannot be accurately aligned to each other. This problem will be described with reference to FIG. 12 illustrating the electrode misalignment problem in the electrode substrate according to the present invention. FIG. 12(a) shows a plan view illustrating an electrode substrate in which the electrodes are well aligned to each other and a sectional view along the line A-A'; and FIGS. 12(b) to (d) are plan views illustrating electrode substrates in which "misalignment" is caused. A lower electrode 2, an insulating film 3, and upper electrodes 5 and 6 are layered sequentially in this order on a substrate 1. In FIG. 12(a), both left and right edges of the lower electrode 2 are aligned with the right end of the upper electrode 5 and the left end of the upper electrode 6, respectively, in a manner well aligned with each other. On the other hand, FIG. 12(b) shows a case in which the lower electrode 2 undergoes a misalignment to the lower right on the substrate surface; FIG. 12(c) shows a case in which the upper electrodes 5 and 6 undergo a misalignment to the upper left on the surface of the insulating film; and FIG. 12(d) shows a case in which both of such misalignments are found. Even when the electrodes are finely formed, the occurrence of misalignment degrades the positional aligning between the lower electrode 2 and the upper electrodes 5 and 6, so that unnecessary overlapping and separation between the upper electrode and the lower electrodes are found. When an inkjet method is applied, such "misalignment" is known to occur while a conductive ink ejected from an inkjet head is flying until it adheres to the substrate; and when a transfer printing method is applied, it is known to occur when a pattern of a conductive ink is transferred from the transfer roll to the substrate.

Consequently, when an electrode substrate having the above described configuration free from the defect of electrode misalignment is formed, it is necessary to apply a photolithography method at least to part of the steps; consequently, there is a problem that the reduction of production steps and improvement of utilization efficiency of materials are prevented. Additionally, there is a problem that when a thin film transistor and a semiconductor device such as a display device using the transistor concerned are produced with the electrode substrate provided with misalignment caused as a result of production by using a printing method, the devices are low in performance and uniformity, and cannot be highly integrated or cannot be of high definition.

In view of these problems, it is an object of the present invention to provide an electrode substrate and a method for producing, by using a printing method in place of a photolithography method, the electrode substrate in which a lower electrode and an upper electrode, having fine patterns and accurately aligned to each other, face each other in a self-aligned manner with an insulating film interposing therebetween, and to provide a thin film transistor and a semiconductor device such as a display device, using the above described electrode substrate, and a method for producing the thin film transistor and the semiconductor device.

As measures for solving the above described problems, a method to be described below is used as a method for producing an electrode substrate in which a light-nontransmitting lower electrode, a light-transmitting insulating film having lyophobic/lyophilic regions on the surface thereof and an upper electrode are layered sequentially in this order on the substrate, the electrode substrate being characterized in that a pattern of the lower electrode is approximately aligned with that of the lyophobic region on the surface of the insulating film; the upper electrode is mainly formed on the lyophilic region other than the lyophobic region on the surface of the insulating film; and the pattern of the upper electrode is a self-aligned shape formed by approximately reversing the pattern of the lower electrode. As a member for providing the lyophobic region on the surface of the insulating film, there is used a photosensitive lyophobic film the property of which is converted by light irradiation from the liquid repellent property that allows the liquid dropped on the surface to be repelled to the liquid attracting property that allows the liquid dropped on the surface to spread to wet the surface. First, the above described photosensitive lyophobic film is subjected to pattern fabrication by means of a so-called backside exposure method in which the lower electrode is used as a photomask and the photosensitive lyophobic film is irradiated with light from the backside of the substrate. More specifically, on the insulating film surface not light-shielded by the lower electrode, the photosensitive lyophobic film is removed to form the lyophilic region, and on the insulating film surface light-shielded by the lower electrode, the photosensitive lyophobic film portion having approximately the same shape as that of the lower electrode remains to form the lyophobic region. The upper electrode, characterized by having a pattern that is an approximately inversed shape of the pattern of the lower electrode, is formed in a self-aligned manner by dropping a conductive ink, containing at least one of a metallic ultrafine particle material, a metal complex and a conductive polymer as dispersed in a solvent, mainly on the lyophilic region of the surface of this insulating film so as to coat the region concerned and by baking the coated ink.

Additionally, there is formed a thin film transistor composed of an electrode substrate and a semiconductor film, wherein the electrode substrate is characterized in that a gate electrode is formed as the lower electrode, and a source electrode and a drain electrode are formed as the upper electrode on two or more areas of the lyophilic region separated by the lyophobic region formed on the surface of the insulating film in a pattern approximately aligned with the lower electrode so that the pattern of the upper electrode has an approximately inversed shape of the gate electrode shape as the lower electrode, and the upper electrode is disposed in a manner self-aligned with the gate electrode, the thin film transistor being characterized in that the semiconductor film is formed so that the semiconductor film covers and extends across at least a part of each of the following members on the above described electrode substrate, namely, the source electrode, drain electrode and the lyophobic region (the gate electrode region) interposing therebetween on the surface of the insulating film.

Additionally, there is formed an active matrix thin film transistor substrate composed of an electrode substrate and thin film transistors, wherein in the electrode substrate, a plurality of gate wirings/electrodes are formed as the lower electrodes, and a plurality of signal wirings, a plurality of source/drain electrodes and a plurality of pixel electrodes are formed as the upper electrodes on the lyophilic regions separated into a plurality of regions by the lyophobic region formed on the surface of the insulating film in a pattern that is approximately aligned with the lower electrode, and wherein the semiconductor films of the thin film transistors are formed so that the semiconductor films extend to cover astride at least a part of each of the following members on the electrode substrate, namely, the source electrodes, drain electrodes and lyophobic regions (gate wiring/electrode regions), on the surface of the insulating film, interposing between the source electrodes and the drain electrodes, the active matrix thin film transistor substrate being characterized in that the thin film transistors each are disposed at any one of the intersection portions between the gate wiring and signal wiring.

Additionally, there is formed the active matrix thin film transistor substrate, characterized in that: a plurality of gate wirings/electrodes are formed adjacently to each other as the lower electrodes, wherein the gate wirings/electrodes are characterized by having a shape in which a plurality of adjacently disposed ring-shaped rectangles each having an opening are connected to each other at least at one or more locations; signal wirings and source/drain electrodes are continuously formed as the upper electrodes, in a manner self-aligned with the above described gate wirings/electrodes, in the spaces between the above described rectangles so as to extend across the connection parts between the above described rectangles; and the pixel electrodes each are formed in one of the openings of the ring-shaped rectangles. In particular, there is formed an active matrix thin film transistor substrate, characterized in that in the shape and configuration of the above described plurality of gate wirings/electrodes, the widths of the individual connection parts connecting the plurality of ring-shaped rectangles each having one of the openings in the gate wirings/electrodes and the separations between the plurality of gate wirings/electrodes are smaller than those of the separations between the plurality of ring-shaped rectangles each having one of the openings forming the individual gate wirings/electrodes.

A photosensitive lyophobic monolayer film containing a carbon chain in which at least a part thereof is terminated with a fluorine or hydrogen atom is used as the photosensitive lyophobic film in place of the photoresist.

Additionally, as a method for producing the electrode substrate having the above described characteristics, a photocatalytic material made of titanium oxide, nitrogen-doped titanium oxide, strontium titanate or the like, which displays photocatalysis with the light having the wavelengths that transmit through the substrate, insulating film and photosensitive lyophobic film but do not transmit through the lower electrode, is disposed in the close vicinity of or is adhered to the surface of a light-transmitting substrate on which light-nontransmitting lower substrate, a light-transmitting insulating film and a photosensitive lyophobic film are layered sequentially in this order; and thus, backside exposure is carried out to decompose and remove the photosensitive lyophobic film with the aid of the photocatalytic action displayed by the photocatalytic material that absorbs the light transmitting through the substrate, insulating film and photosensitive lyophobic film, to fabricate the photosensitive lyophobic film so as to have a pattern approximately the same as that of the lower electrode. When this method is applied, a material nontransparent to the photosensitive wavelengths of the photosensitive lyophobic film may be used for at least one of the substrate and the insulating film. The photosensitive lyophobic film can also be fabricated so as to have a pattern approximately the same as that of the lower electrode by using a so-called lift-off method, as a method other than this method, in which the photoresist formed on the insulating film is subjected to backside exposure to be fabricated to form a pattern the same as that of the lower electrode, the photosensitive lyophobic film is layered thereon, and then the photoresist is removed.

The electrode substrate, thin film transistor, and active matrix thin film transistor substrate formed by the above described configuration and production method are used to form a liquid crystal, electrophoresis, or organic electroluminescence display device. Additionally, a semiconductor device such as an RFID tag device is formed by using the above described electrode substrate and thin film transistor in at least a part of the semiconductor device.

The present invention uses a method in which: a photosensitive lyophobic monolayer film is used as a photosensitive lyophobic film as described above in place of a commonly used conventional photoresist; the above described photosensitive lyophobic monolayer film is exposed by using the lower electrode as a photomask to form a lyophilic/lyophobic pattern on the surface of the substrate; and a conductive ink is coated on the lyophilic region of the substrate surface and baked to form the pattern of the upper electrode. Because the pattern formation principle discovered by the inventor is applied in this method, the shape of the lower electrode as the photomask to determine the approximate shape of the upper electrode exhibits such characteristics as described above.

Accordingly, the pattern formation principle applied in the present invention will be described below. First, the difference as a photosensitive lyophobic film between the photosensitive lyophobic monolayer film used in the present invention and a conventional photoresist will be described. Because the photoresist is generally lower in lyophobic property than the photosensitive lyophobic monolayer film, but can form a thick film of the order of 1 μm in thickness, a level difference or bank is formed between a lyophobic region (photoresist portion) and a lyophilic region; this level difference holds a conductive ink to form an electrode pattern. On the contrary, because the photosensitive lyophobic monolayer film is generally higher in lyophobic property than the photoresist, but forms a thin film of about 2 nm or less in thickness, the photosensitive lyophobic monolayer film cannot utilize such a level difference or bank effect as described for the photoresist and is characterized in that the lyophobic monolayer film concerned confines the conductive ink within the lyophilic regions with the aid of the lyophobic effect to form an electrode pattern.

FIG. 11 shows the relation between the lyophilic/lyophobic patterns formed of a photosensitive lyophobic monolayer film and an electrode pattern formed by coating. The pattern formation principle applied in the present invention will be described using this figure. FIGS. 11(1) to (3) show the conditions that electrode patterns of the same shape are formed on the basis of the three different lyophobic patterns, as can be seen from the plan views and the sectional views obtained by cutting along the A-A' and B-B' directions of the respective substrates. The portion having a lyophobic film 4, formed of the photosensitive monolayer film on the substrate 1 in each figure, forms the lyophobic region, and the portion having no such lyophobic film forms a lyophilic region. Here, a region in which, when pure water is dropped on a substrate, a so-called contact angle between the substrate surface and the drop of water is about 90° or more is defined as a lyophobic region, and a region having a contact angle of 45° or less is defined as a lyophilic region.

In FIG. 11(1), the lyophobic region is of the ring shape having a closed outer periphery surrounding a rectangular lyophilic region inside the lyophobic region. When a conductive ink is coated on this lyophilic region, the conductive ink does not wet and spread over the lyophobic region but is confined within the lyophilic region. An electrode 5 having the same shape as the above described lyophilic region is obtained by baking the ink thus confined. This is a general pattern formation principle under which such an electrode can also be obtained in the same manner when a photoresist is used as a lyophobic film.

In FIG. 11(2), as compared with FIG. 11(1), a part (a right center part in this figure) of the ring-shaped lyophobic region is cut by a long and thin lyophilic region. In this case, when a conductive ink is coated on the rectangular lyophilic region, with almost all of the outer periphery thereof being surrounded by the lyophobic region, the conductive ink neither wets to spread over the lyophobic region in the same manner as in FIG. 11(1), nor penetrates into the cut part of the lyophobic region, and an electrode having approximately the same shape as in FIG. 11(1) is obtained by baking the thus coated ink. A necessary condition for the conductive ink not to leak from the cut part of the lyophobic region has been found to require that the gap width of the part cut by the lyophilic region be smaller than the shortest width of the lyophilic region (the short side for the rectangle shown in this figure). This is understood to be ascribable to a general property of liquid to be described so that the dropped conductive ink tends to reduce the surface area (surface energy) so as to be as small as possible. Such an effect that the conductive ink, namely, a liquid material held within a relatively wider lyophilic region, does not penetrate into a relatively narrower lyophilic region connected to the above described relatively wider region will be hereinafter referred to as "the nonpenetration effect of conductive ink."

On the other hand, in FIG. 11(3), as compared to FIG. 11(1), the ring-shaped lyophobic region is linked with a long and thin lyophobic region disposed in the central part thereof, to divide the rectangular lyophilic region surrounded by the lyophobic region into the upper and lower sections. Also in this case, when a sufficient amount of conductive ink is coated on the rectangular lyophilic region, the outer periphery thereof being surrounded by the lyophobic region, the conductive ink does not wet and spread over the outer-periphery lyophobic region in the same manner as in FIG. 11(1), but wets and spreads over the above described long and thin connection part of the lyophobic region, to connect the conductive ink sections coated on the two, namely, upper and lower lyophilic regions into one section, which is baked to yield an electrode having approximately the same shape as in FIG. 11(1). A necessary condition for the conductive ink sections coated on two lyophilic regions to be connected into one section by the flow of the conductive ink over the lyophobic region intervening between the two regions has been found to require that the width of the long and thin lyophobic region intervening the lyophilic regions be smaller than the shortest width of the lyophilic region for dropping the conductive ink (short side for the rectangle shown in this figure). This is understood to be ascribable to a general property of liquid to be described so that the dropped conductive ink tends to reduce the surface area (surface energy) so as to be as small as possible by having one unified form rather than two divided forms. Such an effect that the conductive ink sections, namely, liquid material sections held within two relatively wider lyophilic regions with a relatively narrower lyophobic region intervening therebetween, are linked to form one unified region by the flow of the conductive ink over the above described narrower lyophobic region will be hereinafter referred to as "the crosslinkage effect of conductive ink." This crosslinkage effect cannot be obtained when a photoresist having level difference is used as a member for forming the lyophobic region, but can only be obtained when the photosensitive lyophobic monolayer film having almost no level difference is used as in the present invention.

In the present invention, in order to form an upper electrode with a conductive ink, by taking advantage of the above described "nonpenetration effect of conductive ink" and "crosslinkage effect of conductive ink," the above described techniques are applied to the shape of the photosensitive lyophobic film and to the shape of the lower electrode to be used as the photomask to determine the shape of the photosensitive lyophobic film. The details concerned will be specifically described in examples to be presented below.

According to the present invention, the pattern of the upper electrode has a shape in which the lower electrode is approximately inversed owing to the above described effects, and the upper electrode is aligned with the lower electrode in a self-aligned manner. Accordingly, when a printing method such as inkjet printing capable of forming fine patterns is used as a method for forming a lower electrode, the upper electrode formed by the printing method also comes to have a fine pattern, and is also aligned with the lower electrode in a self-aligned manner. Consequently, it is possible to form an electrode substrate in which a lower electrode and an upper electrode, having fine patterns and being accurately aligned with each other in a self-aligned manner, face each other with an insulating film interposing therebetween, without using a photolithography method, and to form a thin film transistor and a semiconductor device such as a display device, by using the electrode substrate.

BRIEF DESCRIPTION OF THE DRAWINGS

FIG. 12 shows plan views and a sectional view illustrating the problem of misalignment of electrodes in an electrode substrate;

FIG. 14 shows a plan view and a sectional view illustrating the main device configuration of a display device of the present invention;

FIG. 15 shows views illustrating a backside exposure method for a photosensitive lyophobic film and its device configuration of the present invention;

FIG. 16 shows diagrams illustrating the effect of reducing the number of steps for producing an electrode substrate of the present invention;

BEST MODE FOR CARRYING OUT THE INVENTION

Figure 1:
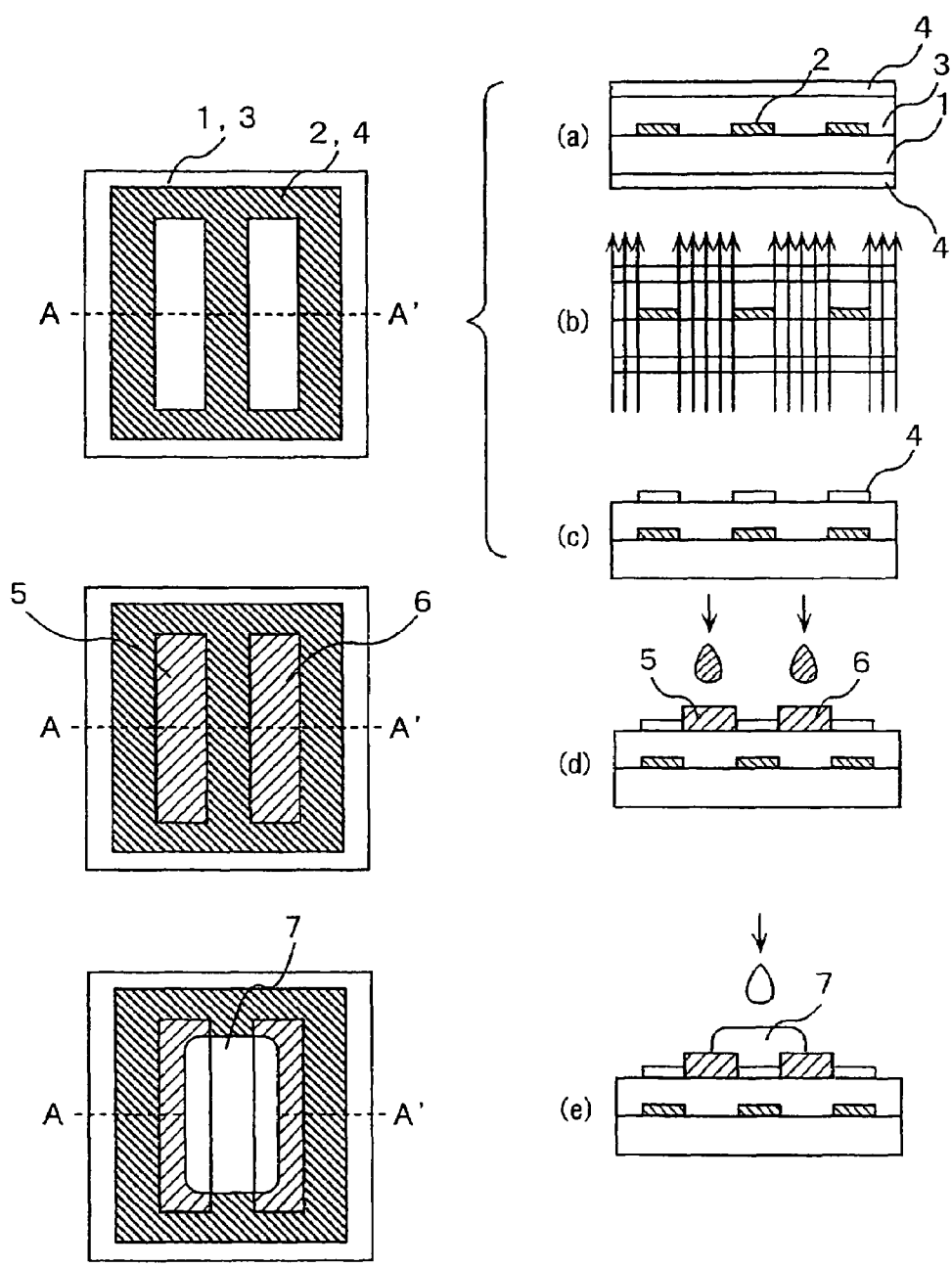
FIG. 1 shows plan views and sectional views illustrating one example of an electrode substrate and a thin film transistor of the present invention, and their production methods.

Hereinafter, several examples of the present invention will be specifically described with reference to drawings. First, a photopatterning method based on backside exposure of a photosensitive lyophobic film, to be a common technique, will be described with reference to FIG. 13.

First, there is prepared an electrode substrate in which a lower electrode 2, a light-transmitting insulating film 3 and a photosensitive lyophobic film 4 are layered sequentially in this order on a light-transmitting substrate 1. For example, a 1 mm thick quartz substrate is used for the substrate 1; a 140 nm thick Cr thin film is used for the lower electrode 2; a 400 nm thick silicon oxide film is used for the insulating film 3; a fluorinated alkyl silane coupling agent, typified by $CF_3$ $(CF_2)_7(CH)_2SiCl_3$ and the like, that is a lyophobic monomer having a carbon chain terminated with a fluorine group in at least a part thereof is used for the photosensitive lyophobic film 4; and these are formed in the following methods respectively. The lower electrode 2 was formed by depositing a 400 nm thick Cr thin film at a substrate temperature of 200° C. with a DC magnetron sputtering device and by subsequently processing it with a ceric ammonium nitrate solution as an etching solution in a photolithography method (FIG. 13(*a*)). The insulating film 3 was deposited at a substrate temperature of 350° C. on the basis of a plasma chemical vapor deposition method (plasma CVD method), with tetraethoxysilane (TEOS) and oxygen ($O_2$) as source gases. The photosensitive lyophobic film 4 was formed by thoroughly cleaning the surface of the substrate 1 having the lower electrode 2 and the insulating film 3 layered thereon sequentially in this order as described above, and by coating, in combination with subsequent drying, a solution prepared by dispersing the above described silane coupling agent in a fluorinated solvent with spin coating, dip coating, spraying or the like (FIG. 13(*b*)). The above described substrate was subjected to so-called backside exposure by irradiating the backside with the light emitted by a low pressure mercury lamp for about 30 minutes (FIG. 13(*c*)). The light irradiation path is indicated by arrows in the figure. On completion of the backside exposure, the photosensitive lyophobic film 4 was removed from the light-irradiated region (the non-light-shielding region of the lower electrode) on the surface of the insulating film 3 to form a lyophilic region, and the photosensitive lyophobic film remained on the non-light-irradiated region (the light-shielding region of the lower electrode) on the surface of the insulating film 3 to form a lyophobic region; and this was confirmed by the following methods. The presence or absence of the photosensitive lyophobic film was identified by determining the presence or absence of fluorine with photoelectron spectroscopy such as XPS and UPS, and TOF-SIMS (Time-of-Flight Secondary Ion Mass Spectrometry). Measurement of the contact angle carried out by dropping pure water on the surface of the insulating film 3 gave a contact angle of 100° to 120° to the non-light-irradiated region, but a contact angle of 30° or less to the light-irradiated region. Dipping of the substrate into pure water and pulling the substrate out of the pure water gave the results that the pure water adhered only to the light-irradiated region (non-light-shielding region of the lower electrode) on the surface of the insulating film 3, and the overlapping width between the pure water and the edge of the lower electrode 2 as observed in the direction vertical to the substrate was 1 µm or less.

Figure 13:
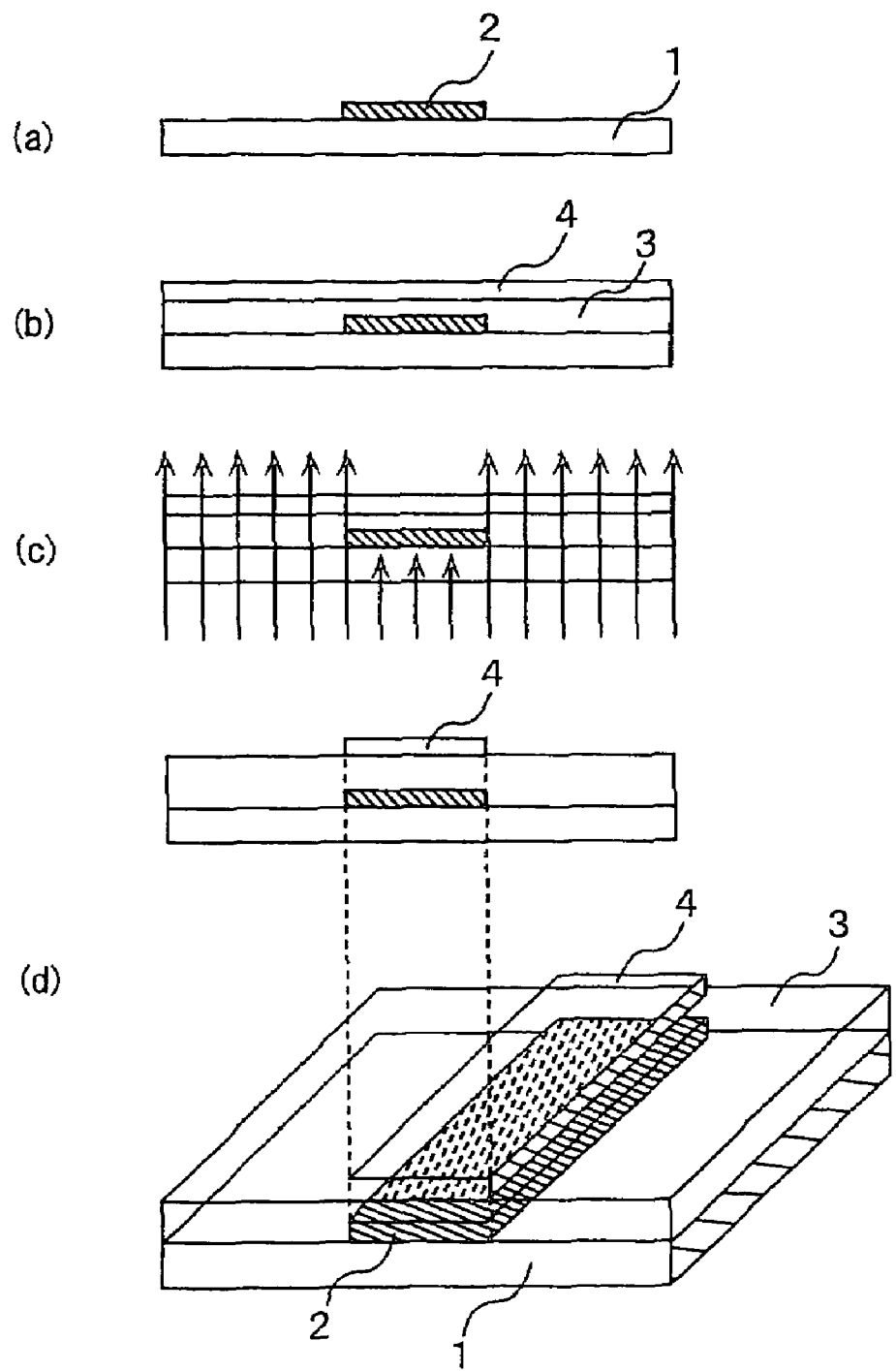
FIG. 13 shows views illustrating a backside exposure patterning method for a photosensitive lyophobic film of the present invention.
Figure 17:
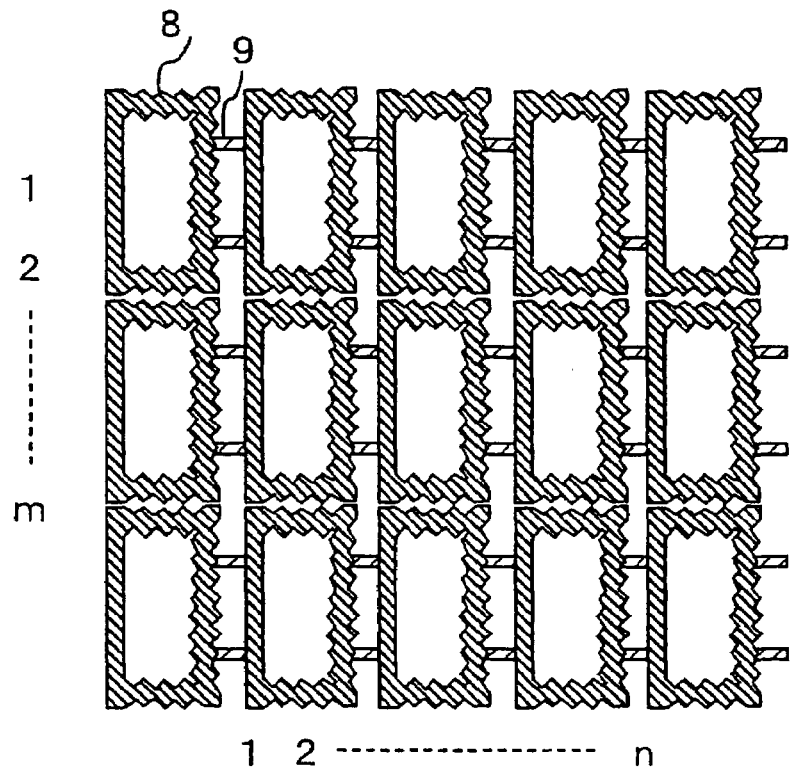
FIG. 17 shows a plan view illustrating an m×n active matrix TFT substrate of the present invention and its production method.

From the above described results, it was verified that the photosensitive lyophobic film 4 was fabricated so as to have a pattern approximately the same as that of the lower electrode 2 on the basis of the backside exposure method utilizing the lower electrode 2 as a photomask (FIG. 13(*d*)).

In the following examples, the shape of the lower electrode 2 to be used as a photomask is devised according to intended purposes to fabricate the photosensitive lyophobic film so as to have a pattern approximately the same as that of the lower electrode 2. In this connection, the shape of the lower electrode 2 and that of the photosensitive lyophobic film 4 superpose each other in the plan views of the electrode substrate, so that they cannot be presented so as to be identifiable in the plan views of the electrode substrate; accordingly, in the following figures, the set of reference numerals 2, 4 found in a figure means that the photosensitive lyophobic film 4 is disposed above the lower electrode 2 so as for the photosensitive lyophobic film 4 to have a shape approximately the same as that of the lower electrode 2. As for the substrate 1 and the insulating film 3, the set of reference numerals 1, 3 is given in a plan view so as to have the same meaning.

EXAMPLE 1

FIG. 1 shows a plan view and a sectional view illustrating one example of an electrode substrate and a thin film transistor of the present invention and their production methods. The lower electrode 2 and the insulating film 3 were layered sequentially in this order on the substrate 1, for example, with the same members and forming methods as in FIG. 13. However, in the present example, the pattern of a gate electrode to be the lower electrode 2 had two openings disposed adjacently to each other. In the present example, because the photosensitive lyophobic film 4 was coated by dip coating before backside exposure, the photosensitive lyophobic film 4 adhered to the surface of the insulating film 3 as well as to the back surface of the substrate 1 (FIG. 1(*a*)). With backside exposure, the photosensitive lyophobic film 4 was removed from the back surface of the substrate 1 to form a lyophobic region having a pattern approximately the same as that of the lower electrode 2 on the surface of the insulating film 3 (FIGS. 1(*b*)) and (*c*)). A conductive ink made of a liquid material containing at least one of a metal ultrafine particle material, a metal complex and a conductive polymer, was coated on two lyophilic regions surrounded by the lyophobic region, formed on the insulating film 3, and the coating ink was baked to form upper electrodes 5 and 6 (FIG. 1(*d*)). No particular constraint is imposed on the conductive ink, as long as the conductive ink is a liquid material having such properties that it is repelled from the lyophobic region formed of the photosensitive lyophobic film 4 and it wets and spreads over the lyophilic region from which the photosensitive lyophobic film 4 is removed, and exhibits a sufficiently low resistance value after baking; specific examples of such a material to be usable include a solution in which a metal ultrafine particle material of about 10 nm or less in diameter or a metal complex, mainly composed of Au, Ag, Pd, Pt, Cu, Ni or the like, is dispersed in a solvent such as water, toluene or xylene. Further, for the purpose of forming ITO (indium tin oxide) as a transparent electrode material, a solution in which a metal alkoxide such as $In(O-i-C_3H_7)_3$ or $Sn(O-i-C_3H_7)_3$ is dispersed in a solvent such as water or an alcohol can be used. Furthermore, as the transparent electrode material other than this, an aqueous solution of PEDOT (poly-3,4-ethylenedioxythiophene), polyaniline (PAn), polypyrrole (PPy) or the like doped with PSS (polystyrene sulfonic acid) being a conductive polymer can also be used. It was possible to form the upper electrodes 5 and 6 each having a film thickness of about 100 nm with any one of the above described materials by dropping them in an amount enough to cover the above described two lyophilic regions and then baking them at an appropriate temperature of about 80 to 500° C. under vacuum or in the air. In the present example, the upper electrodes 5 and 6 were formed as two rectangular shapes on the lyophilic regions other than the lyophobic region on the surface of the insulating film, and the pattern was a self-aligned shape in which the pattern of the lower electrode 2 was approximately inversed.

In the above described example, Cr was used as the lower electrode material, but any other material nontransparent to the exposure wavelengths may be used. For example, Al, Mo, Au, Ag, Pd, Cu, or the like may also be used. In the above described example, quartz, silicon oxide and a fluorinated alkyl silane coupling agent were used for the substrate 1, the insulating film 2 and the photosensitive lyophobic film 4, respectively, but any other suitable materials may also be used; however, the materials for the substrate 1 and the insulating film 2 are limited depending on the material for the photosensitive lyophobic film 4, because they are required to transmit the exposure wavelengths of the photosensitive lyophobic film 4. A fluorinated alkyl silane coupling agent was used as the material for the photosensitive lyophobic film, but other materials may also be used provided they are lyophobic monomers each having a carbon chain terminated with a fluorine group in at least a part thereof; for example, oxetane derivatives, such as perfluorooxetane having a fluorine substituent in a side chain as described in JP-A-2001-278874, may also be used. However, because the exposure wavelength of each of these materials for the photosensitive lyophobic film is 300 nm or less, the materials for the substrate 1 and the insulating film 2 are required to be such materials that transmit the wavelengths of 300 nm or less (having a band gap of 4 electron volts (eV) or more), and quartz and silicon oxide were used, respectively, in the above described example. The silicon oxide film may also be a film prepared with coating and baking in a so-called sol-gel method, in addition to a film prepared with the plasma chemical vapor deposition method. In addition to silicon oxide, silicon nitride ($Si_3N_4$), silicon oxynitride (SiON), aluminum oxide ($Al_2O_3$) or zirconium oxide ($ZrO_2$) may also be used. The material for the substrate 1 may also be synthetic quartz.

Methods for alter the photosensitive wavelengths of the photosensitive lyophobic film to be longer wavelengths of 300 nm or more include the following two methods. One is a method which uses a photosensitive lyophobic film made of a molecule having a dye group thermally decomposable through absorbing the light having a wavelength of 300 nm to 700 nm; specific examples of such a molecule include the following compounds 1 and 2:

Methods for synthesizing these compounds will be described below.

(Synthesis of Compound 1)

Compound 1 was synthesized by the following reactions (i) to (iii).

(i) Reduction of Lyophobic Material

Krytox 157FS-L (50 parts by weight) manufactured by Du Pont Corp. (average molecular weight 2500) was dissolved in PF-5080 (100 parts by weight) manufactured by 3M Corp. The solution was added with lithium aluminum hydride (2 parts by weight) and heated at 80° C. under stirring for 48 hours. The reaction solution was poured into ice water, and the lower layer was separated. The separated lower layer was washed with 1% hydrochloric acid, and then washed with water until the washings became neutral. After removing water in the washed solution by filtering with a filter paper, PF-5080 was evaporated with an evaporator to obtain compound 3 (45 parts by weight) in which the terminal of Krytox 157FS-L was converted into $CH_2OH$.

$$F—\{CF(CF_3)—CF_2O\}_n—CF(CF_3)—CH_2OH \quad \text{Formula 3}$$

Compound 3

(ii) Reaction for Introducing Dye Skeleton

Compound 3 (45 parts by weight) was dissolved in HFE-7200 (100 parts by weight) manufactured by 3M Corp. The solution was added with Reactive Yellow 3 (another name: Procyon Yellow HA) (12 parts by weight), ethanol (100 parts by weight) and sodium carbonate (2 parts by weight) and refluxed for 30 hours. The structure of Reactive Yellow 3 is shown below.

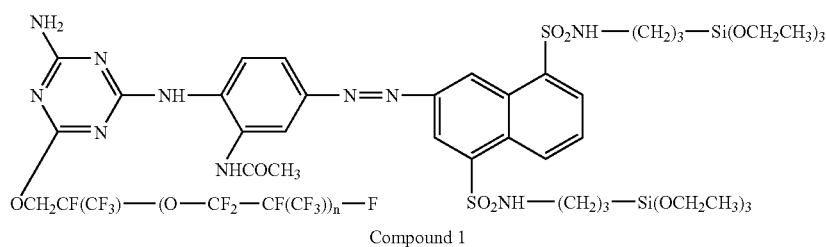

[Formula 1]

Compound 1

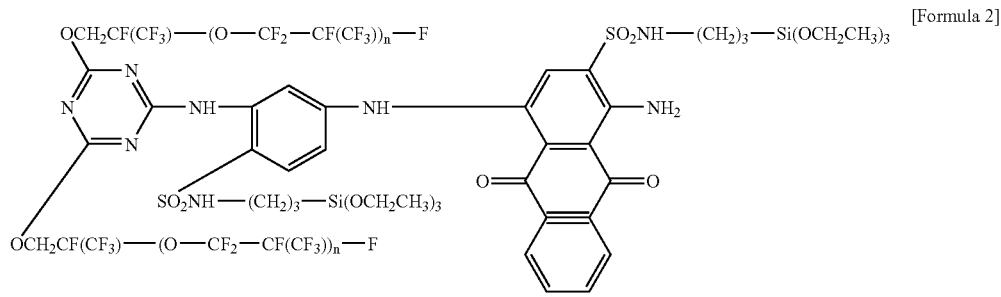

[Formula 2]

Compound 2

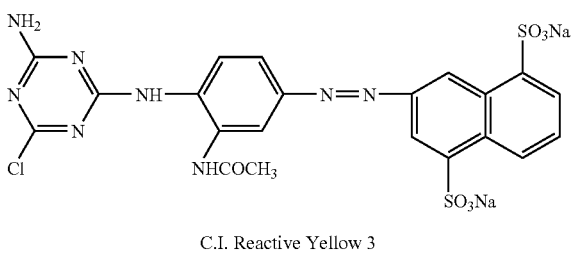

C.I. Reactive Yellow 3

The solvents (HFE-7200 and ethanol) in the reaction solution were evaporated with an evaporator. The residue was added with a mixture of HFE-7200 (100 parts by weight), 35% by weight hydrochloric acid (100 parts by weight) and ice water (100 parts by weight), vigorously stirred and then allowed to stand at rest. The lower layer was separated and washed with water until the washings became neutral. After removing water in the washed solution by filtering with a filter paper, HFE-7200 was evaporated with an evaporator to obtain compound 4 (45 parts by weight) in which Reactive Yellow 3 was bonded to compound 28.

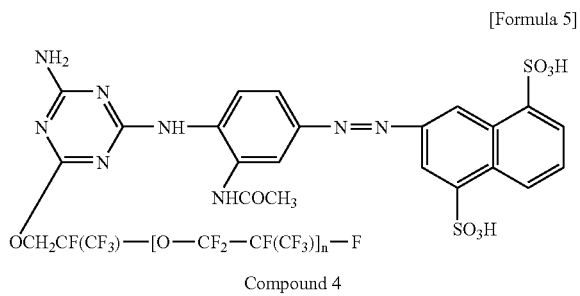

Compound 4

(iii) Reaction for Introducing Binding Site

Compound 4 (45 parts by weight) was dissolved in HFE-7200 (100 parts by weight). On cooling of the resultant solution to around 0° C., the solution was added with Sila-Ace S330 (10 parts by weight) manufactured by Chisso Corp., N,N-dicyclohexylcarbodiimide (10 parts by weight), and dichloromethane (20 parts by weight), and stirred for 3 hours. The reaction solution was made to again get back to room temperature, and further stirred for 30 hours. The reaction solution was allowed to stand at rest, and thereafter, when the reaction solution was separated nearly into two layers, the lower layer was separated. It is to be noted that a turbid layer produced between the upper and lower layers was not added to the lower layer. The lower layer was washed with dichloromethane (20 parts by weight) a few times and then filtered with a filter paper. Then, the solvent (HFE-7200) in the solution was evaporated with an evaporator to obtain target compound 1 (40 parts by weight).

(Synthesis of Compound 2)

Compound 2 (40 parts by weight) was obtained in the same manner as in the synthesis of compound 1, except that Mikacion Brilliant Blue RS (7 parts by weight) was used in place of Reactive Yellow 3 (12 parts by weight).

The chemical structure of Mikacion Brilliant Blue RS is shown below.

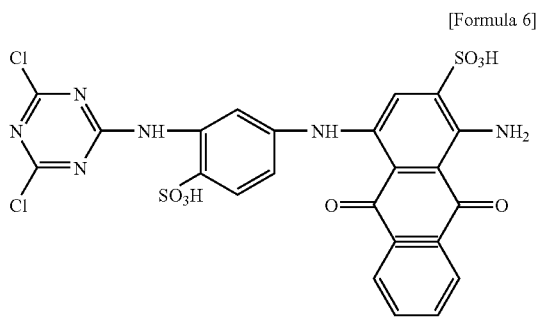

Mikacion Brilliant Blue RS

The sodium sulfonate part is sometimes converted into the sulfonic acid part, and then it is converted into a sodium sulfonate part with sodium hydroxide or the like before use.

When above described compounds 1 and 2 are used for the photosensitive lyophobic film, the substrate 1 and the insulating film 3 may only transmit any wavelengths within the above described wide wavelength range. Accordingly, as an inorganic material for the insulating film 3, in addition to a thin film made of silicon oxide ($SiO_2$), there may be used a thin film having a thickness of 300 nm made of tantalum oxide ($Ta_2O_5$), zirconium oxide ($ZrO_2$) or lanthanum oxide ($La_2O_3$), wherein the thin film is formed with the plasma chemical vapor deposition method or the sol-gel method. Additionally, as an organic material for the insulating film 3, there may be used a spin-coated film of polyvinylphenol (PVP) or polymethylmethacrylate (PMMA). For the substrate 1, there may be used a common glass substrate such as Corning 1737 or various plastic substrates.

Another method for altering the photosensitive wavelengths of the photosensitive lyophobic film 4 to be longer wavelengths uses a photocatalytic material at least in a part of the insulating film 3. The photocatalytic material has the effect of absorbing light to produce holes and electrons having strong oxidizing and reducing power in the film to decompose organic materials to be adjacent to the photocatalytic material.

In this case, all the above described materials can be used for the photosensitive lyophobic film 4. For example, a photocatalytic material composed of, for example, titanium oxide ($TiO_2$) is coated with a sol-gel method to form a film having a thickness of about 10 nm between the insulating film 3 and the photosensitive lyophobic film 4 as described by Tadanaga and Minami in Material Integration, 14(10), pp. 9 to 13 (2001). Because titanium oxide absorbs the light having a wavelength of 400 nm or less to cause photocatalysis, materials transmitting the light having a wavelength of 400 nm or less can be used for the substrate 1 and the insulating film 3. In this case, for the substrate 1, there may be used a glass substrate or a plastic substrate made of polyimide or the like high in light transmittance. For the insulating film 3, there may be used the above described inorganic materials; however, it is recommended not to use organic materials because they are decomposed by the photocatalytic material.

This is also the case for a semiconductor material 7 to be described below, and it is also recommended not to use organic materials for the semiconductor material 7. When there is used, as a photocatalytic material, a so-called visible-light-responsive photocatalytic material which absorbs visible light of wavelengths of 600 nm or less to cause photocatalysis, materials that transmit the light of wavelengths of 600 nm or less can be used for the substrate 1 and the insulating film 3. Consequently, all the above described inorganic materials can be used.

Among methods for fabricating the photosensitive lyophobic film 4 with a photocatalytic material other than the above described materials, a method which allows organic materials to be used for the insulating film 1 and the semiconductor material 7 will be described in Example 6.

A thin film transistor can be fabricated by forming the semiconductor film 7 on the electrode substrate formed as described above of the present invention so that the semiconductor film 7 extends to covers astride at least a part of each of the source electrode 5, the drain electrode 6 and the surface of the insulating film having the gate electrode 2 on the under side thereof. The following materials and production methods can be applied for the semiconductor film 7. The semiconductor film 7 is obtained as follows: an amorphous silicon film having a thickness of about 200 nm is formed as an inorganic material with the plasma chemical vapor deposition method at a substrate temperature of 250° C., with silane and hydrogen ($SiH_4+H_2$) as source gases; and thereafter, the amorphous silicon film is processed into an island-like shape by dry etching with $SF_6$ as an etching gas on the basis of the photolithography method to obtain the semiconductor film 7. This film may also be subjected to laser annealing to yield a polycrystalline silicon film. When inorganic materials are used for the semiconductor film 7 as described above, it is also desirable to use inorganic materials such as silicon oxide and silicon nitride for the insulating film 3. Removal of the photosensitive lyophobic film from the surface of the insulating film 3 before forming the semiconductor film 7 serves to stabilize the interface between the insulating film 3 and the semiconductor film 7, and thus provides good transistor characteristics. For example, a use of amorphous silicon has provided performances comparable with those of common thin film transistors so that the field effect mobility is 0.5 $cm^2/Vs$, the threshold voltage is 2 V, and the on/off current ratio is of 7 digits. When organic materials are used, in particular, when low-molecular weight substances are used, the semiconductor film 7 is formed with vacuum deposition of an acene material, typified by pentacene and thiophene oligomers, at a substrate temperature from room temperature to 100° C. Mask deposition or photolithography using oxygen as the etching gas is used to form the semiconductor film 7 to be processed into an island-like shape. In case of pentacene, a pentacene precursor or pentacene derivative is used as a material soluble in a solvent such as toluene or chloroform, and thus, a film can be formed by a coating method such as casting, spin coating or dip coating. When polymeric materials are used, a film can be formed by the above described coating methods with any one of the following polymers: polythiophenes such as poly-3-hexylthiophene (P3HT) having a regio-regular structure (having the orientation in which the whole chain aligns in the same direction with head and tail adjacent to each other) that is a highly regular nano-structure, polyfluorenes such as a copolymer of fluorene-bithiophene (F8T2), and polyphenylenevinylene (PPV). With an organic material used for the semiconductor film 7, the transistor characteristics are improved when the photosensitive lyophobic film 4 above the gate electrode 2 is not removed and the semiconductor film 7 is formed on the photosensitive lyophobic film 4. For example, a pentacene deposited film formed on the photosensitive lyophobic film 4 exhibited such performances that the field effect mobility was 1.0 $cm^2/Vs$, a threshold voltage was −2 V, and the on/off current ratio was of 7 digits. However, when a pentacene deposited film was formed on the insulating film from which the photosensitive lyophobic film 4 had been removed, the performances were degraded such that the field effect mobility was 0.2 $cm^2/Vs$, the threshold voltage was −5 V, and the on/off current ratio was of 4 digits. This is conceivably because the photosensitive lyophobic film 4 has an effect of improving the orientation order of the organic semiconductor material.

EXAMPLE 2

Figure 2:
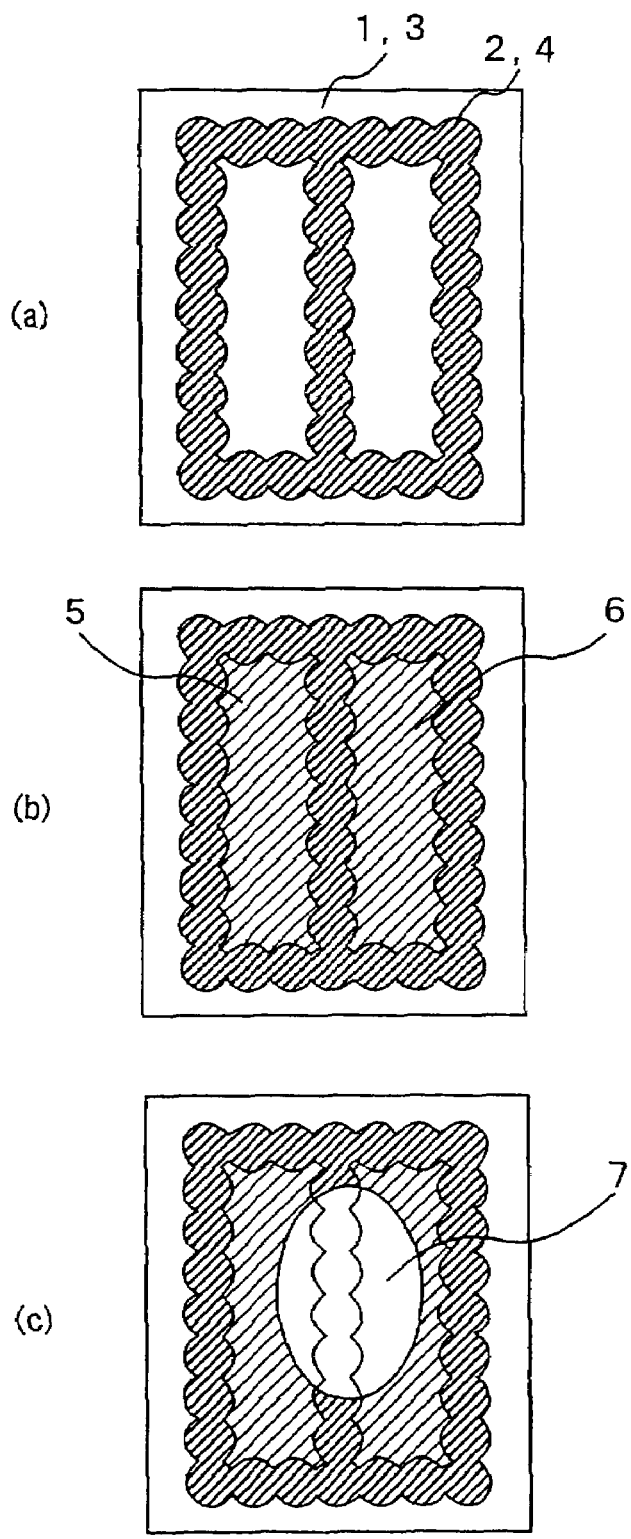
FIG. 2 shows plan views of a thin film transistor of the present invention prepared by a printing method.

In this example, the case in which the lower electrode 2 is formed with a printing method such as an ink jet method and the semiconductor film 7 is formed with a casting method will be described with reference to FIG. 2 showing a plan view of a thin film transistor. For the lower electrode 2, the same material and printing method as those used for the upper electrodes 5 and 6 in Example 1 can be used. For the members other than the lower electrode 2, the same materials and methods as those used in Example 1 can be used. When an ink jet method is used, the lower electrode 2 to be the gate electrode takes on a shape in which dots are sequentially connected to each other as shown in the figure. This is because the conductive ink ejected from the ink jet head isotropically spreads to wet the uniform substrate 1 while retaining the trace of a dot shape formed at the time of ejection. In the present invention, even when the shape of the lower electrode 2 is deformed as described above depending on the fabrication method, the photosensitive lyophobic film pattern having a pattern approximately the same as that of the lower electrode 2 is formed on the insulating film 3 in a self-aligned manner; consequently, the upper electrodes 5 and 6 each can be formed on the insulating film 3 so as to have a pattern approximately the same as the shape obtained by reversing the shape of the lower electrode 2. When P3HT, for example, is coated, to form a film, on the upper electrodes 5 and 6 with a casting method, the semiconductor film 7 is formed in a misaligned position (the figure shows an example shifted in an upper-right direction) as the case may be. Even when such a misalignment is caused, the thin film transistor of the present invention provided uniform switching characteristics. This is due to the following reason. Generally, the thin film transistor characteristics vary to become nonuniform depending on the variations of the parasitic capacitance formed by the member sandwiched between the lower electrode 2, to be the gate electrode, and the upper electrodes 5 and 6, to be the source/drain electrodes. In a common thin film transistor structure, there is adopted a so-called top-contact structure in which the upper electrodes 5 and 6 are formed on the semiconductor film 7. In this connection, when the upper and lower electrodes and the semiconductor film undergo misalignment, the parasitic capacitance varies to make the characteristics nonuniform. On the other hand, in the present invention, the upper and lower electrodes are formed in a self-aligned manner to inhibit misalignment; the present invention also adopts a so-called bottom-contact structure in which the upper and lower electrodes are formed first and then the semiconductor film 7 is formed on the upper electrodes, so that the semiconductor film 7 is not sandwiched between the upper and lower electrodes and does not thereby contribute to the parasitic capacitance. Consequently, the thin film transistor of the present invention provides uniform thin film transistor characteristics even when the upper and lower electrodes 2 and 4 and the semiconductor film 7 are formed with a printing method. Formation of the insulating film with a printing method makes it possible to form all the members on the basis of printing methods to provide a thin film transistor having uniform characteristics.

EXAMPLE 3

Figure 3:
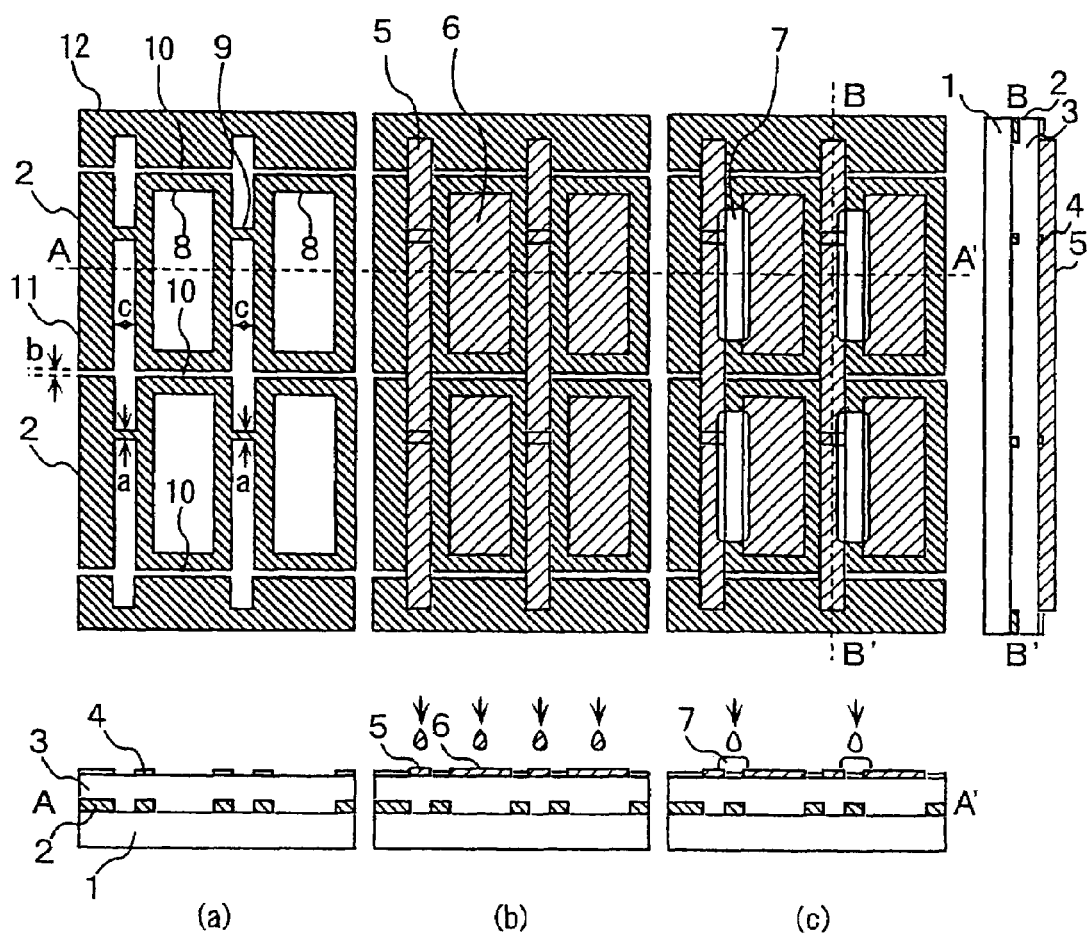
FIG. 3 shows plan views and sectional views illustrating a 2×2 active matrix thin film transistor substrate of the present invention, and its production method.

In the present example, a 2 row 2 column active matrix thin film transistor substrate composed of four thin film transistors formed at the intersections between the two gate electrode wirings forming at least a part of the lower electrodes and the two signal wirings forming at least a part of the upper electrodes, and a method for producing the substrate concerned will be described with reference to FIG. 3 showing the related plan views and sectional views. The materials and the forming methods for respective layers of the present example are the same as those in Examples 1 and 2, so that they will not be described unless particularly required otherwise.

In the present example, for the purpose of utilizing the above described "nonpenetration effect of conductive ink" and "crosslinkage effect of conductive ink" to form the signal wirings/drain electrodes and the source electrodes/pixel electrodes, the shape having the features shown in FIG. 3(a) is adopted as the pattern of the lower electrode 2 for mainly composing gate wirings/electrodes. Specifically, two gate wirings/electrodes, each being characterized by having a shape in which adjacently disposed two ring-shaped rectangles 8 each having an opening are connected at one connection part 9, are disposed adjacently to each other through a space 10 interposing therebetween. A rectangular gate terminal 11 is connected at the left edge of the gate wirings/electrodes 5. Terminal forming lower electrodes 12 to be utilized for forming the terminals of the signal wirings/drain electrodes 5 are adjacently placed at the upper and lower portions of the two gate wirings/electrodes through the spaces 10 interposing therebetween. Particularly, by utilizing, as the shape of the lower electrode 2, a shape in which the width (a in FIG. 3(a)) of the connection part 9 of the gate wiring/electrode and the width (b in FIG. 3(a)) of the space 10 between the gate wirings/electrodes and between the gate wiring/electrode and the terminal forming lower electrode 12 were smaller than the width (c in FIG. 3(a)) of the space between the adjacent ring-shaped rectangles 8 each having an opening, a conductive ink was coated along the space between the rectangles and the coated ink was baked, and there was formed an upper electrode 5, to function as a signal wiring and a drain electrode having a linear shape to be continuously formed by extending over the connection part 9 and disposed along the space between the above described rectangles 8. When a conductive ink was coated on the opening to be the lyophilic region of the ring-shaped rectangle 8 and the coated ink was baked, there was formed an upper electrode 6 to function as a source electrode and a pixel electrode in a self-aligned manner (FIG. 3(b)). There was completed the active matrix thin film transistor substrate in which four thin film transistors were disposed on the respective intersections of the gate wirings/electrodes 2 and the signal wirings/drain electrodes 5, by forming the semiconductor films on the above described electrode substrate so that the semiconductor films extended to cover astride at least a part of each of the signal wirings/source electrodes 5 and the drain electrodes/pixel electrodes 6, on the electrode substrate, and the surface of the insulating film, interposing between the electrodes 5 and 6, having the gate wirings/electrodes 2 in the lower part thereof. The point of the present example resides in that the width of the space between the rectangles 8, namely, the width c of the upper electrode is set so as to be wider than the width a of the space 10 and the width b of the connection part 9 so that when coating and forming the upper electrode 5 to be the signal wiring/drain electrode by using the conductive ink, the short circuit between the upper electrodes 5 may not be caused by penetration of the conductive ink into the space 10 between the gate wirings/electrodes 2, the upper electrodes 5 may not be disconnected by the failure of the conductive ink in spreading over the connection part 9, and the upper electrodes 5 may thereby be formed to be continuous along the longitudinal direction, by taking advantage of the "nonpenetration effect of conductive ink" and the "crosslinkage effect of conductive ink." Specifically, the above advantageous effect was provided by setting such that a=b=3 μm in relation to c=15 μm.

Figure 4:
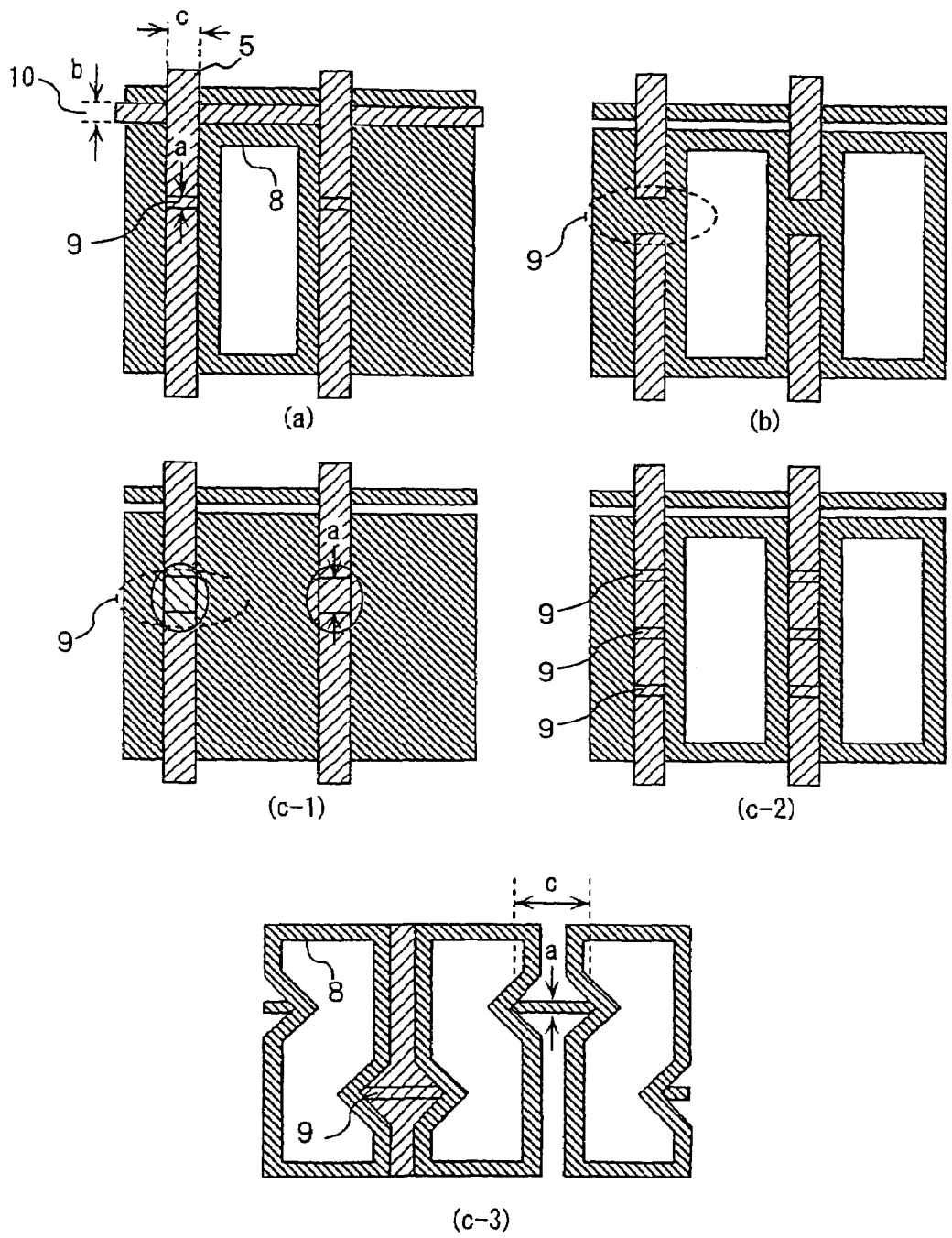
FIG. 4 shows plan views illustrating the shape relation between a lower electrode and a signal wiring/drain electrode of the present invention.

The plan view illustrating the relation between the shape of the lower electrode and the shape of the signal wiring/drain electrode is shown in FIG. 4. FIG. 4(a) shows the case in which the width b of the space 10 was nearly equal to or larger than the width c of the upper electrode 5, wherein the conductive ink penetrated into the space 10 to cause the short circuit between the adjacent upper electrodes 5. FIG. 4(b) shows the case in which the width a of the connection part 9 was nearly equal to or larger than the width c of the upper electrode 5, wherein the conductive ink did not extend over the lyophobic region on the connection part 9 to cause disconnection. Increase of the width a of the connection part 9 as shown in FIG. 4(b) decreases the resistance of the gate wiring/electrode, and accordingly, this increase is favorable for a thin film transistor substrate to be used for a display device. As a countermeasure against this disconnection, FIG. 4(c-1) shows a case in which the conductive ink is re-coated on the connection part to secure connection. At this time, it is recommended that the photosensitive lyophobic film is removed with a HeCd laser or the like before re-coating and a conductive ink having a relatively higher viscosity is used. However, there is a problem in that a modification according to this technique requires time.

It is possible to form the upper electrode 5 or the signal wiring/drain electrode 5 without disconnecting the connection part 9 irrespective as to the magnitude of the width a of the connection part 9, after removing the photosensitive lyophobic film from the surface of the connection part 9 by irradiation with an ultraviolet laser or the like.

FIG. 4(c-2) shows a case in which a countermeasure to prevent a disconnection failure involves the shape of the lower electrode, wherein a plurality of connection parts 9 are provided (3 parts in the figure), and even when the total width of the connection parts 9 is equal to or larger than the width c of the upper electrode, the width of each of the connection parts is made equal to or less than the width c of the upper electrode. Herewith, the conductive ink can extend over the individual connection parts owing to the "crosslinkage effect of conductive ink" to prevent the disconnection of the upper electrode 5 and at the same time the gate wiring/electrode can reduce the resistance. Specifically, the disconnection occurred for one connection part having b=15 μm in relation to c=15 μm, but crosslinkage occurred to prevent the disconnection for three divided connection parts each having a width of 5 μm.

FIG. 4(c-3) shows a case of the lower electrode shape in which the ring-shaped rectangle is recessed inward at the connection part 9 so as to locally increase the width c of the upper electrode, wherein the width c can be made larger than the width a of the connection part 9, so that the "crosslinkage effect of conductive ink" is enhanced to allow the signal wiring part of the upper electrode to be formed without suffering from disconnection.

Figure 5:
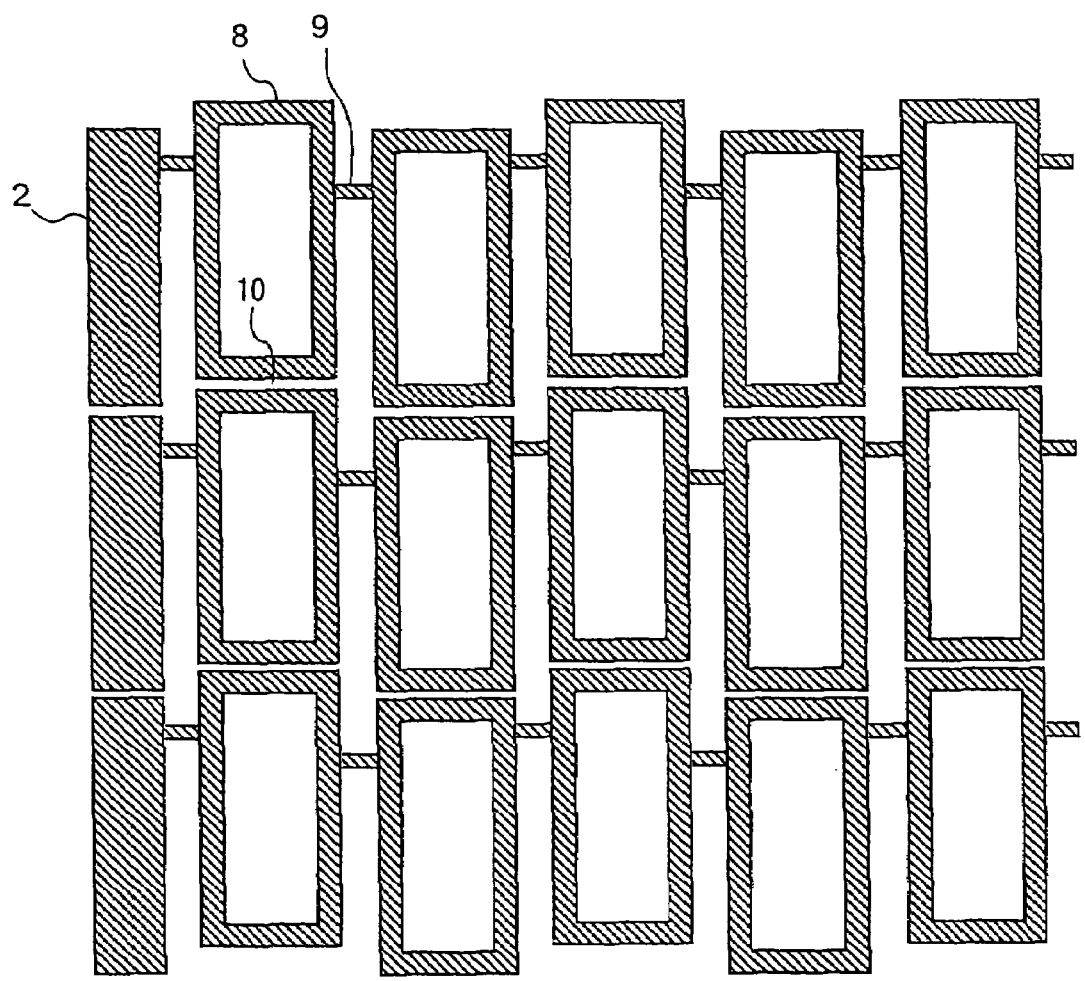
FIG. 5 shows a plan view illustrating the shape of a lower electrode (gate wiring/electrode) of the present invention.

In the examples shown in FIGS. 3 and 4, in the individual gate wirings/electrodes 2, the adjacently disposed ring-shaped rectangles 8 each having an opening are disposed so that the upper and lower edges thereof were aligned horizontally. However, the present invention needs not be limited to this case. For example, as shown in FIG. 5, there may be adopted a configuration in which pluralities of the rectangles 8 are disposed so that the individual pluralities of the rectangles 8 are alternately displaced up and down. It has been confirmed that because in this case, the space 10 between the gate wirings/electrodes do not intersect linearly with the space between the rectangles 8 in which the signal wirings are to be formed, this configuration has the effect to prevent the failure that when a conductive ink is dropped on the space between the rectangles 8, the ink flows into the space 10 in both right and left directions to cause disconnection or short circuit. In this way, it is possible to suppress the disconnection failure and the short circuit failure of the signal wirings formed with a coating process, not only by taking advantage of the nonpenetration effect of conductive ink through reducing the width of the space 10 as described above but by devising the shape of the gate wirings/electrodes.

As described above, it was possible to form an active matrix thin film transistor substrate in which a thin film transistor is disposed on the gate wiring/signal wiring intersection, by forming an electrode substrate in which a gate wiring/electrode faced a signal wiring/drain electrode and a source electrode/pixel electrode in a self-aligned manner through an insulating film interposing therebetween. When the methods described in Examples 1 and 2 are used, the active matrix thin film transistor substrate can be fabricated exclusively by using printing methods.

Finally, the conductive ink material for forming the upper electrodes 5 and 6 will be mentioned. When this substrate is used for a light-transmitting display device, the pixel electrode/source electrode 6 needs to be transparent, so that the coating-type ITO material or the conductive polymer materials described in Example 1 are used. When this substrate is used for a reflective display device, it is effective to use Ag or the like having a high reflectance in the visible light wavelength region for the purpose of improving the display performance.

EXAMPLE 4

Figure 6:
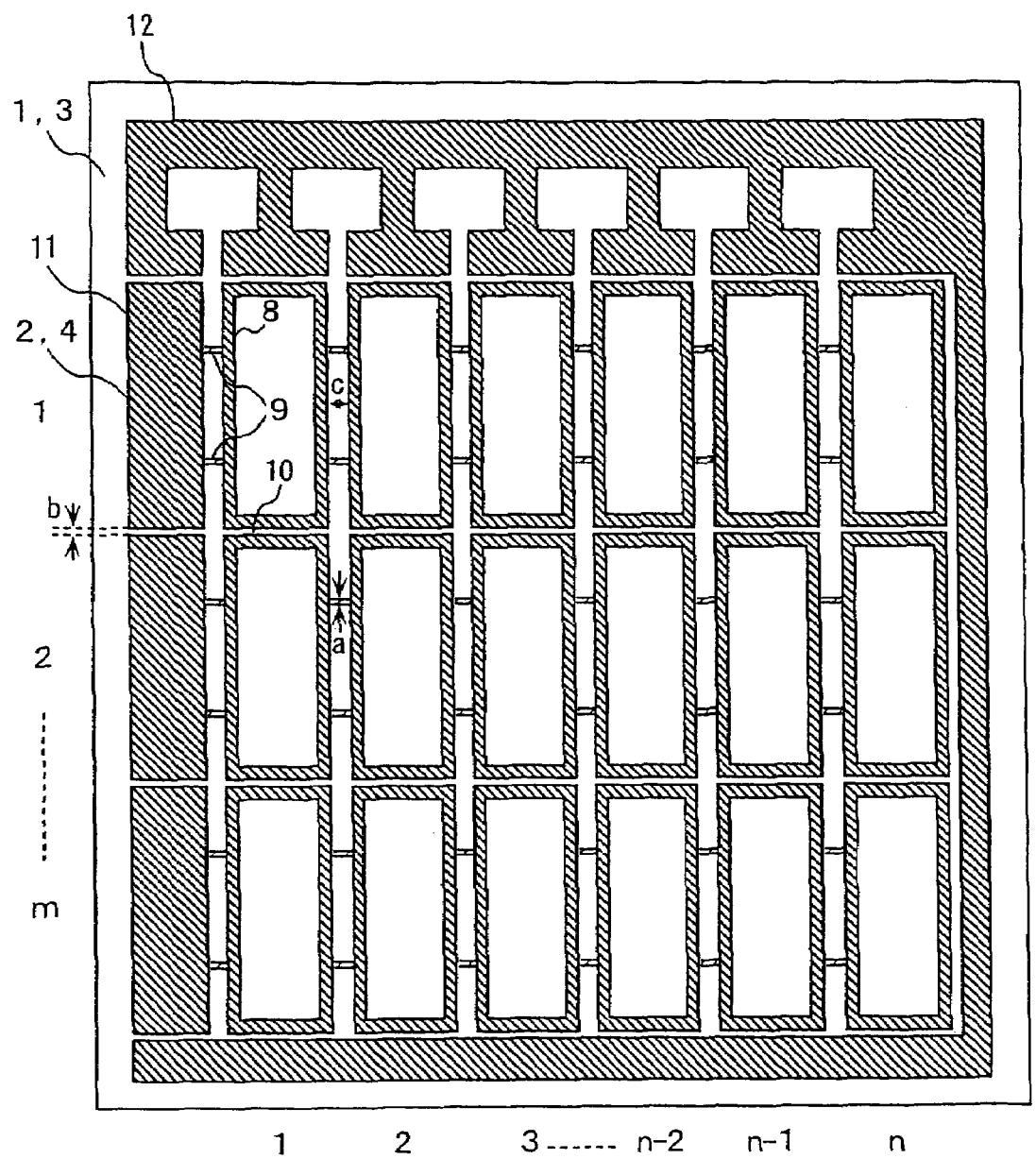
FIG. 6 shows a plan view illustrating an m×n active matrix thin film transistor substrate of the present invention and its production method.
Figure 10:
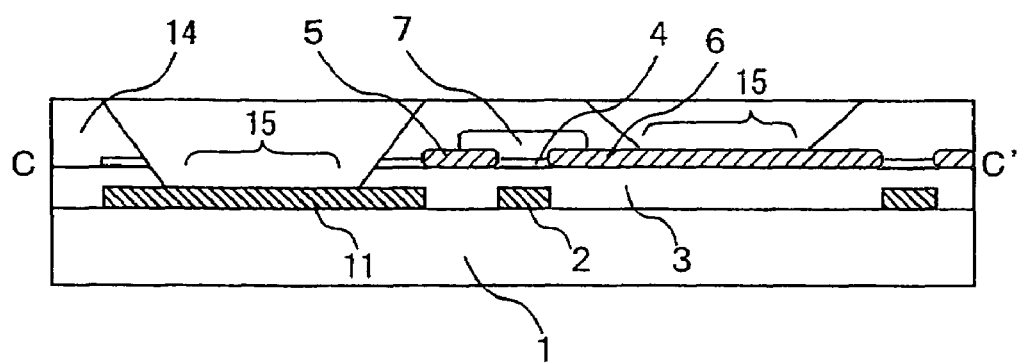
FIG. 10 shows a sectional view illustrating an m×n active matrix thin film transistor substrate of the present invention.
Figure 11:
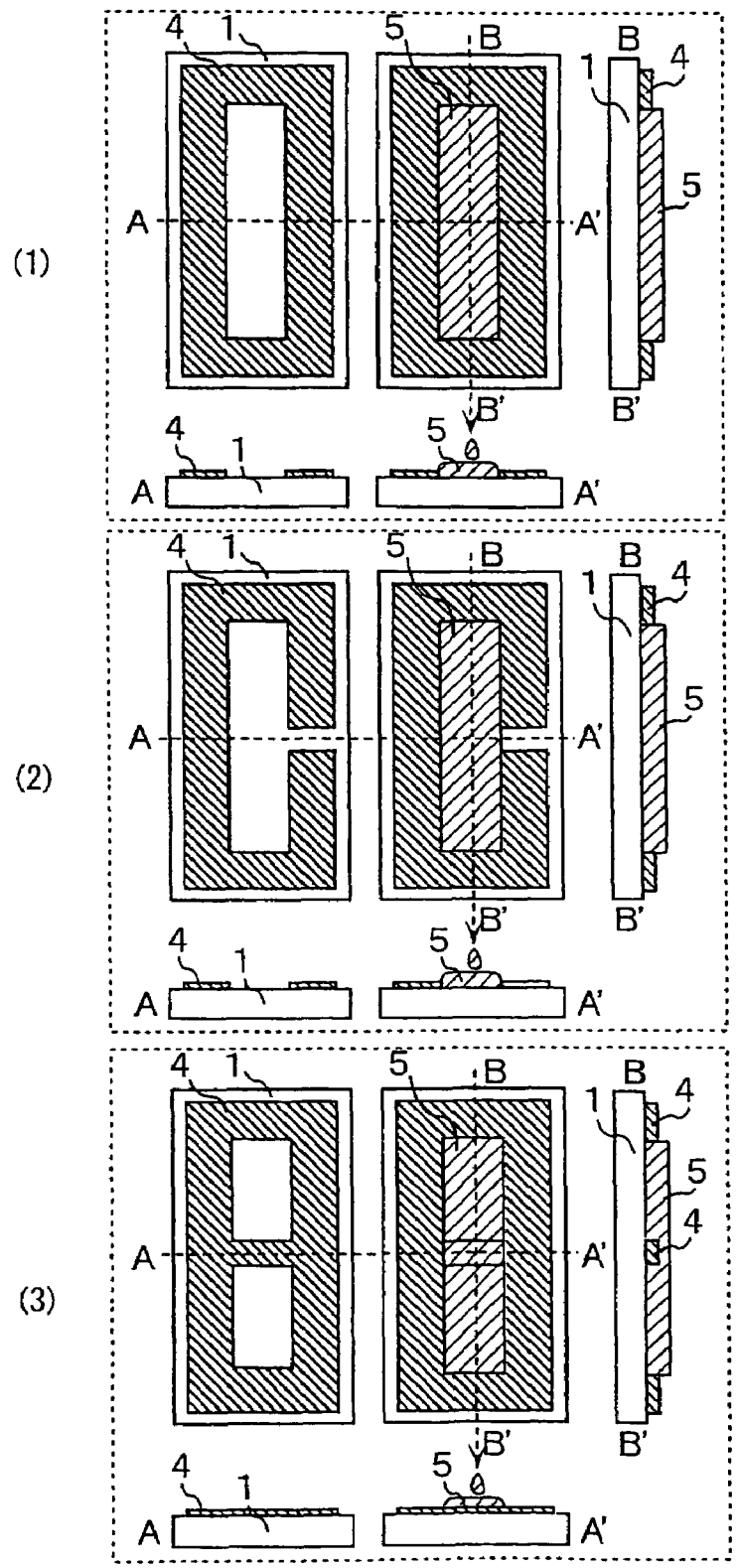
FIG. 11 shows views illustrating the formation principle of coated electrode patterns with the aid of a photosensitive lyophobic monolayer film as applied in the present invention.

In the present example, an m-row n-column active matrix thin film transistor substrate composed of m×n pieces of thin film transistors formed at the intersections of m pieces of gate electrode wirings which form at least a part of the lower electrodes and n pieces of signal wirings which form at least a part of the upper electrodes, and a method for producing the substrate concerned will be described below with reference to FIGS. 6 to 9 each showing a plan view and FIG. 10 a sectional view thereof. The basic configuration is the same as that in Example 3. First, m pieces of gate wirings/electrodes 2, in each of which n pieces of ring-shaped rectangles each having an opening are adjacently disposed and connected to each other at least at one or more connection parts 9 (two connection parts in the present example), are adjacently disposed to each other through spaces 10 (FIG. 6). Particularly, when the width b of the space 10 and the width a of each of the connection parts 9 are made to be equal to or smaller than the space c between the ring-shaped rectangles each having an opening, it is possible to form n pieces of upper electrodes 5, which function as the signal wirings/drain electrodes, in a linear shape continuously self-aligned with the lower electrodes in a manner extending over the lyophobic regions on the connection parts 9, by coating a conductive ink on the space c and baking it. The penetration of the conductive ink into the spaces 10 to short the upper electrodes 5 to each other will not occur.

Figure 7:
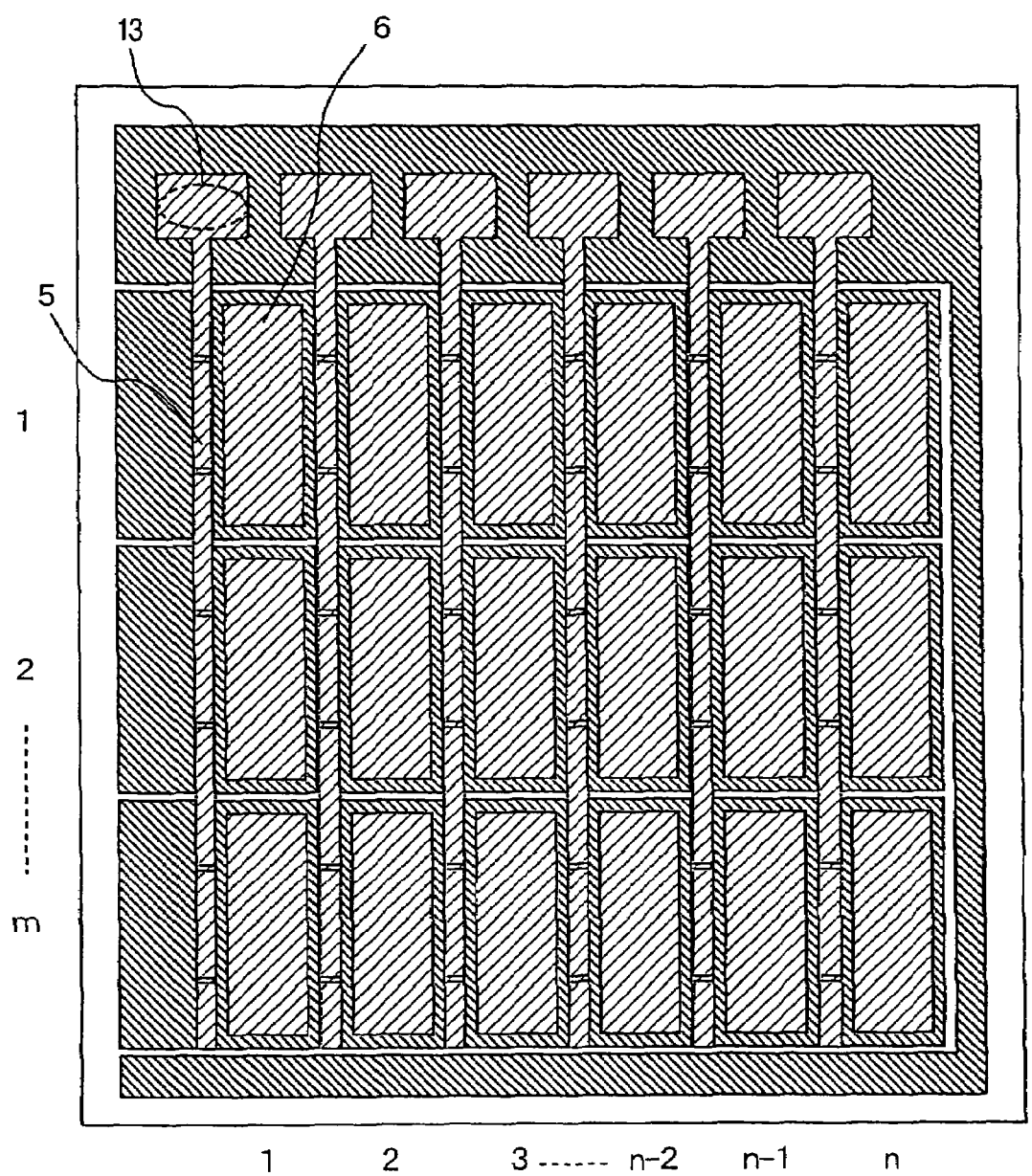
FIG. 7 shows a plan view illustrating an m×n active matrix thin film transistor substrate of the present invention and its production method.
Figure 8:
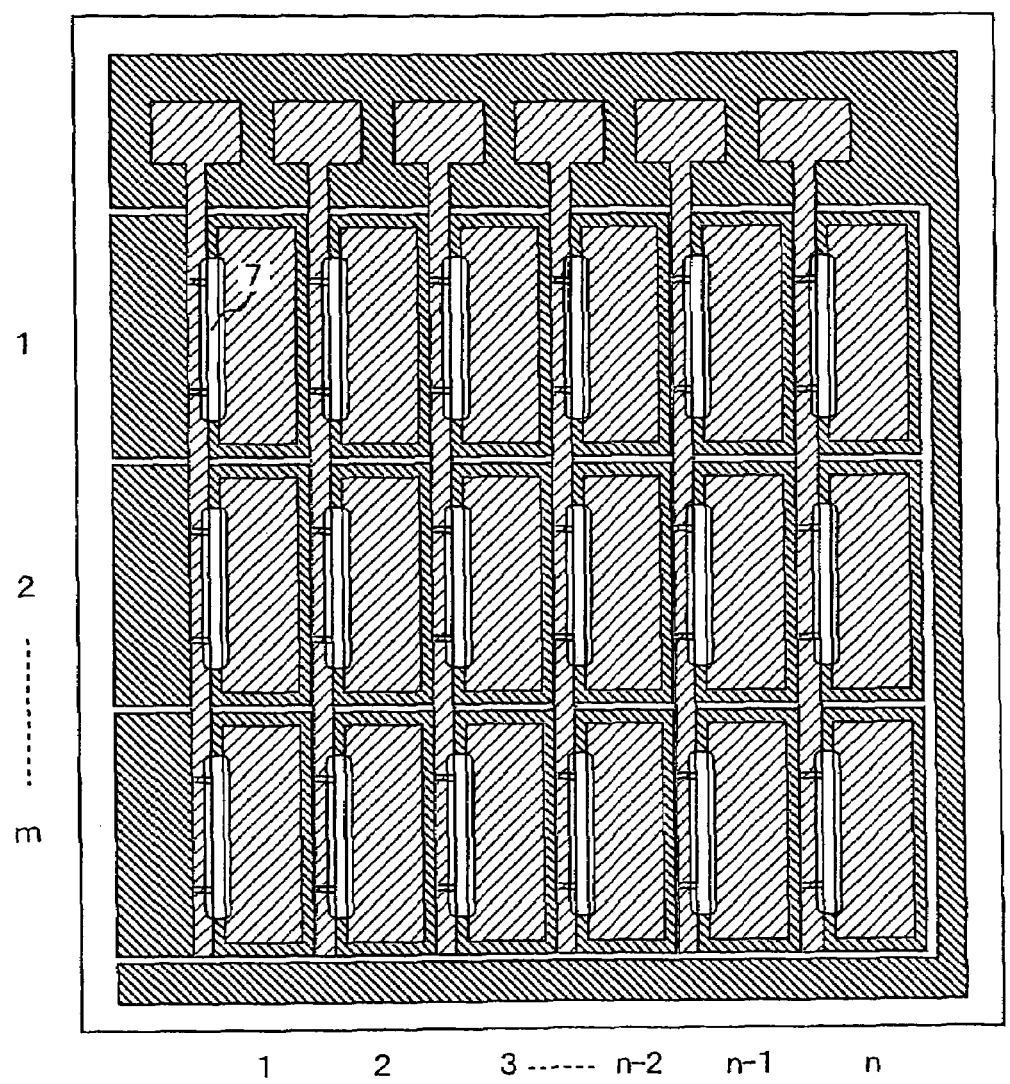
FIG. 8 shows a plan view illustrating an m×n active matrix thin film transistor substrate of the present invention and its production method.
Figure 9:
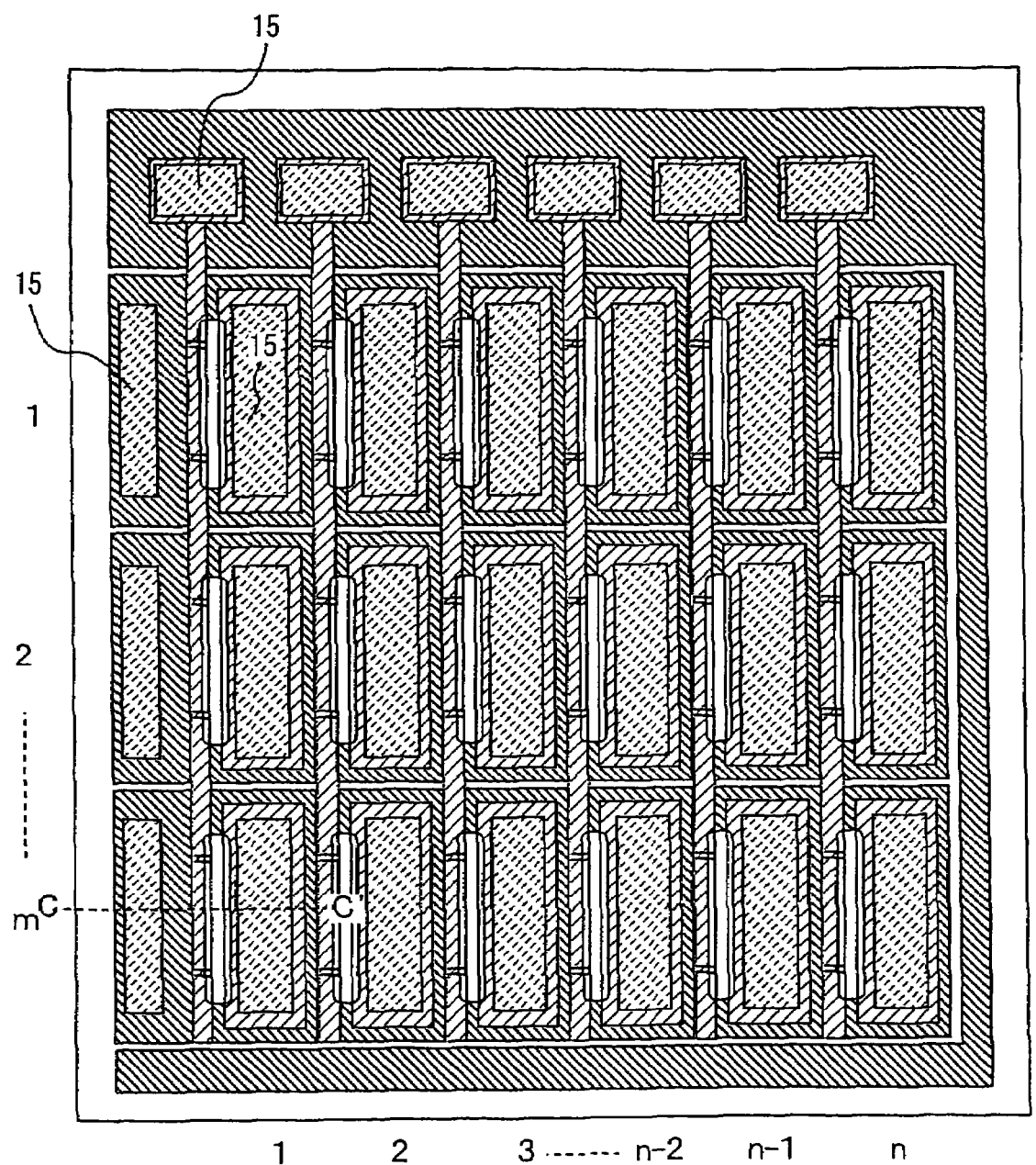
FIG. 9 shows a plan view illustrating an m×n active matrix thin film transistor substrate of the present invention and its production method.

Additionally, in the present example, an integrally formed lower electrode 12 for forming terminals is disposed so as to surround the outer periphery of m pieces of the gate wirings/electrodes 2 as a part of the lower electrode 2. For the purpose of preventing the formation of the upper electrodes 5 at the edge of the substrate 1 outside the lower electrode 12 for forming terminals, a sealing mask may be applied on this portion, and may be removed after forming the upper electrodes 5. Furthermore, in the present example, the width of the signal terminal part 13 for the lower electrode 12 for forming terminals was set to be larger than the width c of the upper electrode. The reason for this is that the contact resistance with the signal circuit to be described hereinafter is decreased by increasing the area of the upper electrode terminal, and the signal terminal part 13 is also used as ink reservoirs for coating and forming the relatively long signal wirings 5 with a conductive ink. More specifically, when the conductive ink dropped along the space having the width c for forming the wirings 5 is too large in quantity, the conductive ink flows into the signal terminal part 13, and when it is too small in quantity, the conductive ink is supplied from the signal terminal part 13; thus, the signal terminal part 13 serves to form the upper electrodes 5 with an appropriate quantity of conductive ink (FIG. 7). By forming the semiconductor film 7 on the electrode substrate with the same arrangement, techniques and materials as those in Example 3, m×n pieces of thin film transistors are formed at the intersections between the m pieces of gate wirings 2 and the n pieces of signal wirings 5 (FIG. 8). Further thereon, a protective film 14 is formed, and thereafter, through holes 15 are formed by removing the protective film from above the pixel/source electrode 6, gate terminal 11, and signal terminal 13. For the purpose of forming the protective film and the through holes, for example, silicon nitride or silicon oxynitride is formed with a plasma chemical vapor deposition method at a substrate temperature of 150° C. or higher, and is subjected to a dry-etching processing based on a photolithography method with $SF_6$ as an etching gas. When the through holes are formed, a small displacement of their positions does not cause a serious problem, so that the photoresist may be printed to form the through holes. Alternatively, the protective film and through holes can be formed en bloc by printing after coating and pre-baking of an organic film made of a photosensitive polyimide or the like and subsequent mask exposure and development. When the printing production method described in Example 3 and this protective film/through hole printing production method are used in combination, an active matrix thin film transistor substrate can be formed in which the gate wiring/electrode 2 and the signal wirings/pixel electrodes 5 and 6 are disposed in a manner self-aligned with each other through the insulating film 3 interposing therebetween only by using printing methods without using a photolithography method. Alternatively, needless to say, when the lower electrode 2 is finely fabricated with a photolithography method, the upper electrodes 5 and 6 can also be finely formed as an inversed pattern of the pattern of the lower electrode 2, and a high-definition active matrix thin film transistor substrate can thereby be formed.

EXAMPLE 5

In the present example, a display device using the active matrix thin film transistor substrate of the present invention will be described with reference to FIG. 14 showing a plan view and a sectional view of the main device configuration. A gate scanning circuit 17 is connected to a gate terminal 11 of an active matrix thin film transistor substrate 16, and a signal circuit 18 is connected to a signal terminal 13, with a TAB (Tape Automated Bonding) method or a COG (Chip on Glass) method; and both of these circuits are further connected to a control circuit 19. Display elements 20 each are sandwiched between a pixel electrode of the active matrix thin film transistor substrate 16 and a counter electrode 21. The thin film transistor, connected to the gate wiring/electrode applied with a scanning voltage output from the gate scanning circuit 17, is operated, the signal voltage supplied from the signal circuit in a manner synchronized with the scanning voltage is applied to the pixel electrode connected to the thin film transistor, and the display elements undergo a so-called linear sequential drive to operate the display device. To the configuration of the thin film transistor substrate of the present example, capacitance driven elements such as liquid crystal display elements or electrophoresis elements can be applied as the display elements 20. In the case of the In-Plane-Switching liquid crystal display device, as is well known, the counter electrode 21 is disposed in the thin film transistor substrate, so that the configuration is different from the present figure, but the above described display elements can be applied basically in the same manner. On the other hand, in the case of current driven display elements for an organic electroluminescence device (OLED) or the like, the above described display elements can also be applied, if a well known active matrix thin film transistor substrate for driving OLED is fabricated according to the present invention; this display device can be applied to the flat display for cellular phones, flat televisions, laptop PCs and the like. Alternatively, needless to say, the thin film transistor of the present invention can be applied to any semiconductor devices, other than display devices, using thin film transistors, such as RFID devices typified by contactless IC cards.

EXAMPLE 6

In the present example, the backside exposure method of a photosensitive lyophobic film and the device configuration will be described with reference to FIG. 15 showing the schematic configuration thereof. There is prepared a substrate 1 on which a lower electrode 2 and an insulating film 3 are layered sequentially in this order and thereafter a photosensitive lyophobic film 4 is dip-coated. In this case, the photosensitive lyophobic film 4 is adhered to the backside of the substrate 1 and to the surface of the insulating film 3. A photocatalyst film 24 typified by titanium oxide having a thickness of about 200 nm, formed on the surface of a supporting plate 23 made of aluminum or the like with a built-in heating mechanism such as a sheathed heater, is adhered to the above described substrate 1 (FIG. 15 (*a*)). In order to improve the adhesion, it is effective to interpose a rubber sheet made of PDMS or the like between the supporting plate 23 and the photocatalyst film 24 as a cushion. Irradiation from the backside of the substrate 1 with the light having the wavelengths transmitting through the substrate and the insulating film to be absorbed by the photocatalyst film produces hole carriers having a strong oxidizing power on the surface of the photocatalyst film 24. These hole carriers directly decompose the adjacent photosensitive lyophobic film, and the photosensitive lyophobic film 4 is fabricated so as to have a pattern approximately the same as that of the lower electrode 2. In this connection, preliminary heating of the photocatalyst film 24 with the heating mechanism to 100° C. or higher improves the pattern fabrication accuracy of the photosensitive lyophobic film 4 to allow fabrication to attain a minimum pattern width of 3 μm. This is conceivably because when moisture attaches to the surface of the photocatalyst film, the hole carriers oxidatively decompose the water to produce OH radicals, and the OH radicals indirectly decompose the photosensitive lyophobic film, so that the OH radicals drift and migrate in the space between the photocatalyst film 24 and the photosensitive lyophobic film 4 to decompose and remove even the photosensitive lyophobic film 4 in a light-shielding region. When adsorbed moisture is preliminarily removed from the surface of the photocatalyst film by heating, the indirect decomposition process caused by the OH radicals does not work, but only the direct decomposition process by the hole carriers having a short migration distance does work, improving the pattern fabrication accuracy of the photosensitive lyophobic film 4. Additionally, as compared to the photocatalyst film 24 having an irregular surface, the photocatalyst film 24 having a flat and smooth surface improves the adhesion between the photocatalyst film 24 and the photosensitive lyophobic film 4, and the pattern fabrication accuracy and efficiency are thereby improved.

As described in Example 1, when titanium oxide is used as a photocatalytic material, the exposure wavelengths are 400 nm or less, and accordingly materials transmitting these wavelengths are used for the substrate 1 and the insulating film 3. When a visible-light-responsive photocatalytic material such as nitrogen-doped titanium oxide is used, the exposure wavelengths are 600 nm or less, and accordingly materials transmitting these wavelengths are used for the substrate 1 and the insulating film 3. In the present method, no photocatalytic material is used in the insulating film, so that organic materials having the above described conditions can be used for the insulating film 3 and the semiconductor film 7. When the photosensitive lyophobic film is fabricated with the present method, the light having the wavelengths that do not directly process the photosensitive lyophobic film can be used for the backside exposure. Consequently, as for the materials for the electrode substrate, in relation to a fluorinated alkyl silane coupling agent having a photosensitive wavelength of 300 nm or less to be used as the photosensitive lyophobic film 4, a material nontransparent to the photosensitive wavelengths of the photosensitive lyophobic film can be used for at least one of the substrate and the insulating film, for example, so that a glass substrate such as Corning 1737 is used for the substrate 1 or an organic material such as PVP is used for the insulating film 3.

EXAMPLE 7

Figure 18:
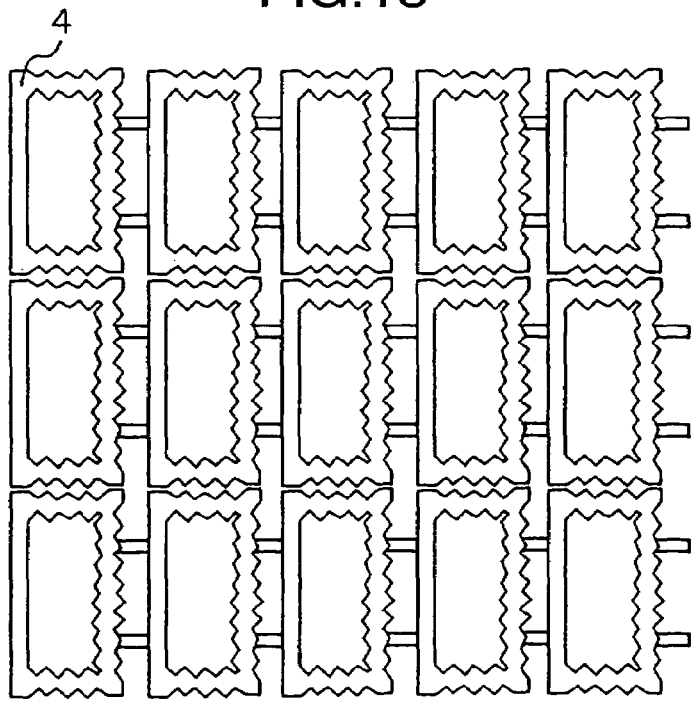
FIG. 18 shows a plan view illustrating an m×n active matrix TFT substrate of the present invention and its production method.
Figure 19:
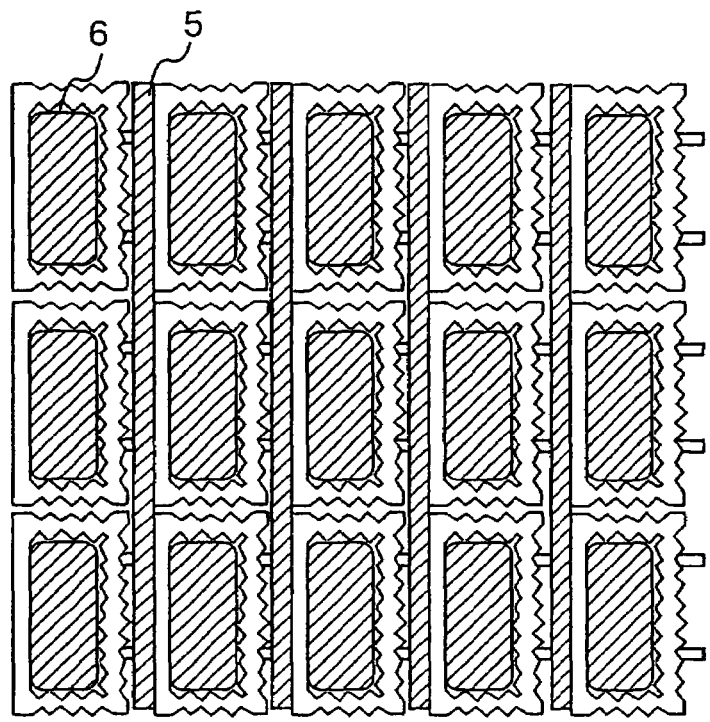
FIG. 19 shows a plan view illustrating an m×n active matrix TFT substrate of the present invention and its production method.
Figure 20:
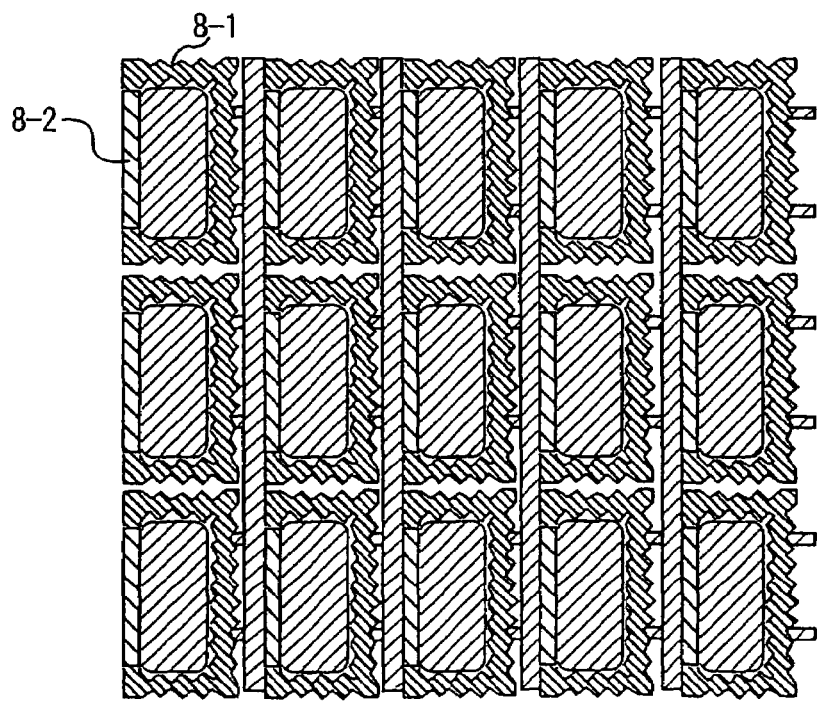
FIG. 20 shows a plan view illustrating an m×n active matrix TFT substrate of the present invention and its production method.
Figure 21:
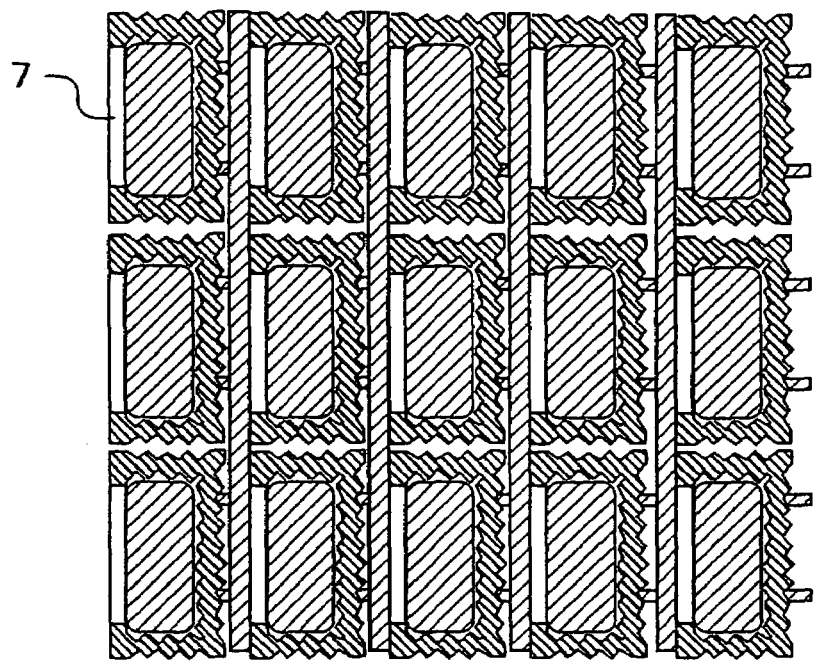
FIG. 21 shows a plan view illustrating an m×n active matrix TFT substrate of the present invention and its production method.
Figure 22:
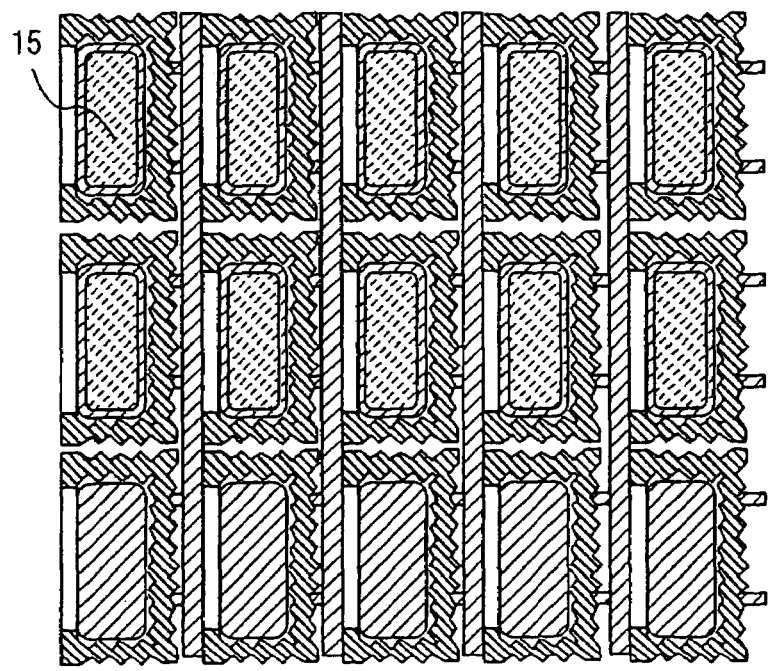
FIG. 22 shows a plan view illustrating an m×n active matrix TFT substrate of the present invention and its production method.

In the present example, an m-row n-column active matrix thin film transistor substrate and a method for producing the substrate concerned will be described, similarly to Example 6, with reference to FIGS. 17 to 22 showing the plan views of the substrate concerned. The most prominent feature of the present example resides in that, in a rectangle 8, as shown in the figure, a sawtooth-like shape is adopted for each of the three sides other than the left side on which a semiconductor film 7 is formed. This is a design to prevent the false operation caused by the electric interference of an adjacent thin film transistor, as will be described later. On a plurality of gate wirings 2 (FIG. 17) composed of the rectangles 8 and the connection parts 9 and disposed adjacently to each other, an insulating film 3 and a photosensitive lyophobic film 4 are layered sequentially in this order (not shown in the figure), and the photosensitive lyophobic film is fabricated into a shape approximately the same as that of the gate wirings 2 with the backside exposure (FIG. 18). By using an appropriate quantity of a conductive ink, signal wirings 5 and pixel electrodes 6 are formed. In this case, the signal wirings 5 and the pixel electrodes 6 are formed in line shapes or rectangle shapes in the same manner as in FIG. 7, in particular, so as to for the ends of each of the signal wirings 5 and the pixel electrodes 6 to contact the tips of the sawtooth-like upper, lower and right sides of any one of the rectangles 8. This is because the liquid conductive ink to be used for formation of the signal wirings 5 and the pixel electrodes 6 is more stable in energy in the case where the ink does not penetrate into the recessed portions of the sawtooth-like shape and thus the surface area of the ink is decreased than in the case where the ink penetrates into the recessed portions concerned to increase the surface area thereof. Consequently, as compared to the capacitance formed between the pixel electrode 6 and the left side of the rectangle 8, the capacitance formed between the pixel electrode 6 and the upper, lower and right sides of the rectangle 8 becomes negligibly small. Similarly, as compared to the capacitance formed between the signal wiring 5 and the left side of the rectangle 8, the capacitance formed between the signal wiring 5 and the right side of the rectangle 8 becomes negligibly small. Consequently, each of the signal wirings 5 electrically strongly couples, through the left side of the rectangle 8, only with the pixel electrode 6 with which the signal wiring concerned is in contact on the right side thereof in the figure, and the portion thereof in contact with the other sawtooth-like ends of the rectangle 8 can decrease the electric coupling. A thin film transistor is formed by coating and forming a semiconductor film 7 on the left side of the rectangle 8, in the same manner as in FIG. 8. In the present example, description is made particularly on the method in which the semiconductor film 7 is formed by deposition selectively only on the left side of the rectangle 8. For this purpose, as shown in FIG. 20, the signal wirings 5 and the pixel electrodes 6 are formed by coating, and thereafter, by partial irradiation with ultraviolet light from the surface by using a photomask, the photosensitive lyophobic film is removed from the portion 8-1 other than the left side of the rectangle 8. This substrate is set in a vacuum deposition apparatus, and pentacene semiconductor molecules are deposited at a substrate temperature and the pressure appropriately adjusted. As a result, the semiconductor film 7 composed of pentacene semiconductor molecules is selectively formed only on the left side 8-2 of the rectangle 8 (FIG. 21) which is still coated with the photosensitive lyophobic film. As for the details of this selective growth, for example, S. Verlaak et al., Physical Review, B68, 194509 (2003) may be referred to. A TFT substrate similar to that in Example 6 is completed by forming a protective insulating film (not shown in the figure) on this semiconductor film 7 and forming the through holes 15 on the pixel electrodes and the like.

As described above, according to the present invention as described in the individual examples, the upper electrodes having the inversed pattern of the pattern of the lower electrodes are formed by utilizing the lyophilic/lyophobic regions formed by the photosensitive lyophobic film on which the lower electrode pattern is transferred by utilizing the lower electrode itself as the photomask, and consequently, the upper electrodes and the lower electrodes are formed in a self-aligned manner to be aligned with each other, and no misalignment is caused even when the lower electrodes are formed with a printing method. Consequently, by using a printing method, there can be formed an electrode substrate in which the upper electrodes and the lower electrodes are accurately aligned with each other through an insulating film interposing therebetween. If the pattern of the lower electrode is devised so that the nonpenetration effect of conductive ink and the crosslinkage effect of conductive ink may be utilized when the upper electrodes are coated and formed with a conductive ink, wirings/electrodes disposed in a self-aligned manner intersecting with each other through an insulating film interposing therebetween can be formed with a printing method.

FIG. 16 illustrates the effect of reducing the number of steps for producing an electrode substrate on the basis of a printing method. According to a conventional lithography method, a formation of an electrode requires 8 steps, and 19 steps are required in total, but according to the printing method of the present invention, an electrode substrate can be produced in a half or less number of steps, namely, in 7 steps, and an effect of productivity improvement is definitely attained.

INDUSTRIAL APPLICABILITY

As described above, the electrode substrate according to the present invention and the thin film transistor using the same are suitable for use in semiconductor devices such as low-price display devices.

The invention claimed is:

1. An electrode substrate in which a lower electrode, an insulating film having lyophobic and lyophilic regions on a surface thereof and an upper electrode are layered sequentially on a substrate, characterized in that:
   the lower electrode has a pattern approximately aligned with that of the lyophobic region on the surface of the insulating film;
   the upper electrode is formed mainly on the lyophilic region other than the lyophobic region on the surface of the insulating film; and
   the upper electrode has a self-aligned pattern in which the pattern of the lower electrode is approximately inversed, wherein the lower electrode comprises a rectangular shaped gate electrode having a sawtooth-like shape on three of four sides.

2. A thin film transistor comprising the electrode substrate according to claim 1 and a semiconductor film, wherein the electrode substrate is characterized in that a source electrode and a drain electrode are formed as the upper electrode on two or more areas of the lyophilic region separated by the lyophobic region formed on the surface of the insulating film in a pattern approximately aligned with that of the lower electrode so that the upper electrode has, in a self-alignment manner, an approximately inversed pattern of the gate electrode as the lower electrode, the thin film transistor being characterized in that:
   the semiconductor film is formed so that the semiconductor film covers and extends across at least a part of each of the following members on said electrode substrate: the source electrode, drain electrode and the surface of the insulating film (the gate electrode region) interposing therebetween.

3. An Radio Frequency Identification Device (RFID), characterized by using the thin film transistor according to claim 2 as at least a part thereof.

4. An active matrix thin film transistor substrate comprising the electrode substrate according to claim 1 and thin film transistors, wherein in the electrode substrate, a plurality of gate wirings/electrodes are formed as the lower electrode, and a plurality of signal wirings, a plurality of source/drain electrodes and a plurality of pixel electrodes are formed as upper electrodes on a plurality of areas of the lyophilic region separated by the lyophobic region formed on the surface of the insulating film in a pattern that is approximately aligned with that of the lower electrode, wherein semiconductor films of the thin film transistors are formed so that the semiconductor films extend to cover astride at least a part of each of the following members on the electrode substrate: the source electrodes, drain electrodes and lyophobic regions (gate wiring/electrode regions), on the surface of the insulating film, interposing between the source electrodes and the drain electrodes, and wherein the thin film transistors are each disposed at any one of the intersection portions between the gate wiring and signal wiring.

5. The active matrix thin film transistor substrate, according to claim 4, characterized in that:
 a plurality of gate wirings/electrodes are formed adjacently to each other as the lower electrodes, wherein the gate wirings/electrodes are characterized by having a shape in which a plurality of adjacently disposed ring-shaped rectangles having ring-shaped openings each having an opening are connected to each other at least at one or more locations;
 signal wirings and source/drain electrodes are continuously formed as the upper electrodes in a self-alignment manner in the spaces between said rectangles so as to extend across connection parts between said rectangles; and
 the pixel electrodes each are formed in one of the ring-shaped openings of said rectangles.

6. The active matrix thin film transistor substrate, according to claim 5, characterized in that the widths of the connection parts connecting the plurality of rectangles, forming individual gate wirings/electrodes, each having one of the openings and the widths of the spaces between the plurality of gate wirings/electrodes are smaller than separations between the plurality of rectangles each having one of the openings forming said individual gate wirings/electrodes.

7. A liquid crystal, electrophoresis, or organic electroluminescence display device, characterized by using the thin film transistor substrate according to any one of claims 4 to 6 as an active matrix switch.

8. The electrode substrate, thin film transistor and active matrix thin film transistor substrate, according to claims 1 to 4 characterized by using a photosensitive lyophobic monolayer film comprising a carbon chain in which at least a part thereof is terminated with a fluorine or hydrogen atom as a photosensitive lyophobic film.

9. The electrode substrate, thin film transistor, and active matrix thin film transistor substrate according to claims 1 to 6 characterized in that the lyophobic region is photosensitive and at least one of the substrate and the insulating film is formed with a material that does not transmit a light having a photosensitive wavelength of the photosensitive lyophobic region.

10. The electrode substrate according to claim 1, wherein a semiconductor film is formed on a fourth side of the rectangularly shaped gate electrode which does not have a sawtooth-like shape.

* * * * *